(12) United States Patent
Shiga et al.

(10) Patent No.: US 7,990,750 B2
(45) Date of Patent: Aug. 2, 2011

(54) FERROELECTRIC MEMORY

(75) Inventors: Hidehiro Shiga, Kamakura (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 12/563,924

(22) Filed: Sep. 21, 2009

(65) Prior Publication Data
US 2010/0124093 A1     May 20, 2010

(30) Foreign Application Priority Data
Nov. 14, 2008   (JP) .................... 2008-292191

(51) Int. Cl.
*G11C 11/22*     (2006.01)

(52) U.S. Cl. ......... 365/145; 365/117; 365/115; 365/139
(58) Field of Classification Search .................. 365/145, 365/117, 115, 139
See application file for complete search history.

(56) References Cited

U.S. PATENT DOCUMENTS
2,876,436 A     3/1959   Anderson
2003/0174532 A1*   9/2003   Matsushita et al. ........... 365/145

FOREIGN PATENT DOCUMENTS
JP           09-116107      5/1997
* cited by examiner

*Primary Examiner* — Thong Q Le
(74) *Attorney, Agent, or Firm* — Knobbe, Martens, Olson & Bear LLP

(57)   ABSTRACT

A ferroelectric memory of an embodiment of the present invention includes m platelines arranged in a first interconnect layer (m is a positive integer), n bitlines arranged in a second interconnect layer (n is a positive integer), and m×n memory cells arranged at m×n intersection points of the m platelines and the n bitlines, each of the m×n memory cells including a ferroelectric capacitor and a zener diode connected in series between any one of the m platelines and any one of the n bitlines.

20 Claims, 19 Drawing Sheets

FERROELECTRIC MEMORY

CROSS REFERENCE TO RELATED APPLICATION

This application is based upon and claims the benefit of priority from the prior Japanese Patent Application No. 2008-292191, filed on Nov. 14, 2008, the entire contents of which are incorporated herein by reference.

BACKGROUND OF THE INVENTION

1. Field of the Invention

The present invention relates to a ferroelectric memory, for example, to a crosspoint ferroelectric memory.

2. Background Art

A ferroelectric memory is a semiconductor memory including a ferroelectric capacitor as a component of a memory cell. In general, the memory cell of the ferroelectric memory includes the ferroelectric capacitor and a transistor. In a current semiconductor processing technique, transistors having the same characteristics can be manufactured only on a surface of silicon. Therefore, the bit number of the ferroelectric memory cannot exceed "the chip area divided by the transistor area", even if the size of the ferroelectric capacitor is minimized to its limit. This is the same in other semiconductor memories including transistors as components of memory cells.

An example of a structure for overcoming this restriction is a memory structure called a crosspoint type. For example, in a crosspoint resistor memory, a memory cell includes a resistor, but does not include a transistor. Therefore, the crosspoint resistor memory is advantageous in that it has a high probability of realizing a highly integrated memory. This is the same in other crosspoint memories.

However, the crosspoint memory has a problem in that a write current leaks also around cells other than a write target cell. Accordingly, the crosspoint memory is defective in that it has a low cell selectivity. Therefore, in the crosspoint memory, a diode is ordinarily inserted to the memory cell to improve the cell selectivity.

However, when this method is applied to the ferroelectric memory, a problem arises in that a current to the capacitor can flow only in one direction due to a rectification by the diode. This is not preferred because the ferroelectric memory must reverse the direction of the current flow to the capacitor, depending on whether it writes "0" or "1" in the memory cell. Accordingly, the ferroelectric memory to which the above method is applied is disadvantageous in that it can write only one of "0" and "1". In this way, the crosspoint ferroelectric memory has a problem in that it is difficult to secure the selectivity of the memory cell.

Japanese Patent Publication No. 3327071 discloses an example of a ferroelectric memory device in which a memory cell includes only a ferroelectric capacitor. Japanese Patent Publication No. 3327071 further discloses an example of a setting of voltages which are applied to a selected cell and a non-selected cell.

SUMMARY OF THE INVENTION

An aspect of the present invention is, for example, a ferroelectric memory including m platelines arranged in a first interconnect layer (m is a positive integer), n bitlines arranged in a second interconnect layer (n is a positive integer), and m×n memory cells arranged at m×n intersection points of the m platelines and the n bitlines, each of the m×n memory cells including a ferroelectric capacitor and a zener diode connected in series between any one of the m platelines and any one of the n bitlines.

Another aspect of the present invention is, for example, a ferroelectric memory including m platelines arranged in a first interconnect layer (m is a positive integer), n first bitlines arranged in a second interconnect layer positioned under the first interconnect layer (n is a positive integer), n second bitlines arranged in a third interconnect layer positioned above the first interconnect layer, and 2×m×n memory cells arranged at m×n intersection points of the m platelines and the n first bitlines and at m×n intersection points of the m platelines and the n second bitlines, each of the 2×m×n memory cells including a ferroelectric capacitor and a zener diode connected in series between any one of the m platelines and any one of the n first bitlines or the n second bitlines.

BRIEF DESCRIPTION OF THE DRAWINGS

FIG. 15 is a circuit diagram of a peripheral circuit of the ferroelectric memory of the third embodiment;

FIG. 16 is a circuit diagram of a peripheral circuit of the ferroelectric memory of the third embodiment;

DESCRIPTION OF THE EMBODIMENTS

Figure 1:
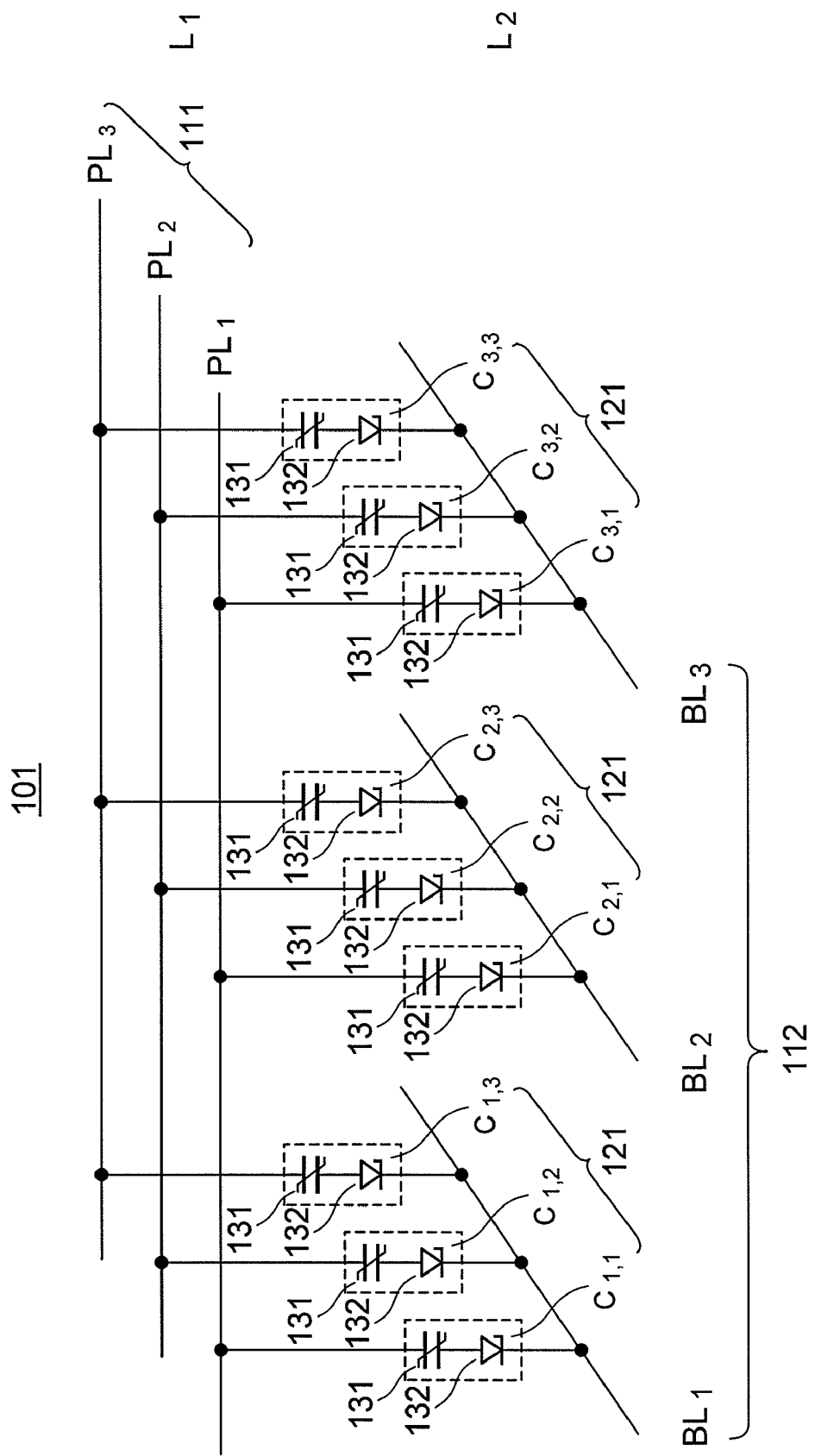
FIG. 1 is a schematic view showing a circuit configuration of a ferroelectric memory of a first embodiment.

Embodiments of the present invention will be described referring to the drawings.

First Embodiment

FIG. 1 is a schematic view showing a circuit configuration of a ferroelectric memory 101 of a first embodiment. The ferroelectric memory 101 of FIG. 1 has m platelines 111 (m is a positive integer), n bitlines 112 (n is a positive integer), and m×n memory cells 121.

The m platelines 111 are arranged in an interconnect layer $L_1$. The interconnect layer $L_1$ is an example of a first interconnect layer of the present invention. FIG. 1 exemplifies three platelines $PL_1$, $PL_2$, and $PL_3$ arranged in the interconnect layer $L_1$.

The n bitlines 112 are arranged in an interconnect layer $L_2$. The interconnect layer $L_2$ is an example of a second interconnect layer of the present invention. FIG. 1 exemplifies three bitlines $BL_1$, $BL_2$, and $BL_3$ arranged in the interconnect layer $L_2$.

Although the platelines 111 are arranged in an upper layer and the bitlines 112 are arranged in a lower layer in FIG. 1, the platelines 111 may be arranged in the lower layer and the bitlines 112 may be arranged in the upper layer.

The m×n memory cells 121 are arranged at m×n intersection points of the m platelines 111 and the n bitlines 112. FIG. 1 exemplifies 3×3 memory cells $C_{1,1}$ to $C_{3,3}$ arranged at 3×3 intersection points of the three platelines $PL_1$ to $PL_3$ and the three bitlines $BL_1$ to $BL_3$. For example, the memory cell $C_{2,2}$ is arranged at an intersection point of the plateline $PL_2$ and the bitline $BL_2$.

Each memory cell 121 has a ferroelectric capacitor 131 and a zener diode 132. In each memory cell 121, the ferroelectric capacitor 131 and the zener diode 132 are connected in series between any one of the m platelines 111 and any one of the n bitlines 112. For example, in the memory cell $C_{2,2}$, the ferroelectric capacitor 131 and the zener diode 132 are connected in series between the plateline $PL_2$ and the bitline $BL_2$.

In each memory cell 121, the ferroelectric capacitor 131 is arranged in the plateline 111 side, and the zener diode 132 is arranged in the bitline 112 side. Each ferroelectric capacitor 131 has one electrode connected to the corresponding plateline 111, and the other electrode connected to the corresponding zener diode 132. Each zener diode 132 has an anode connected to the corresponding ferroelectric capacitor 131, and a cathode connected to the corresponding bitline 112. The positional relation between the ferroelectric capacitor 131 and the zener diode 132 and the direction of the zener diode 132 may be opposite to those of FIG. 1.

The ferroelectric memory 101 of FIG. 1 is a crosspoint ferroelectric memory. In the ferroelectric memory 101 of FIG. 1, each memory cell 121 includes a ferroelectric capacitor 131 and a zener diode 132, but does not include a transistor.

Figure 2:
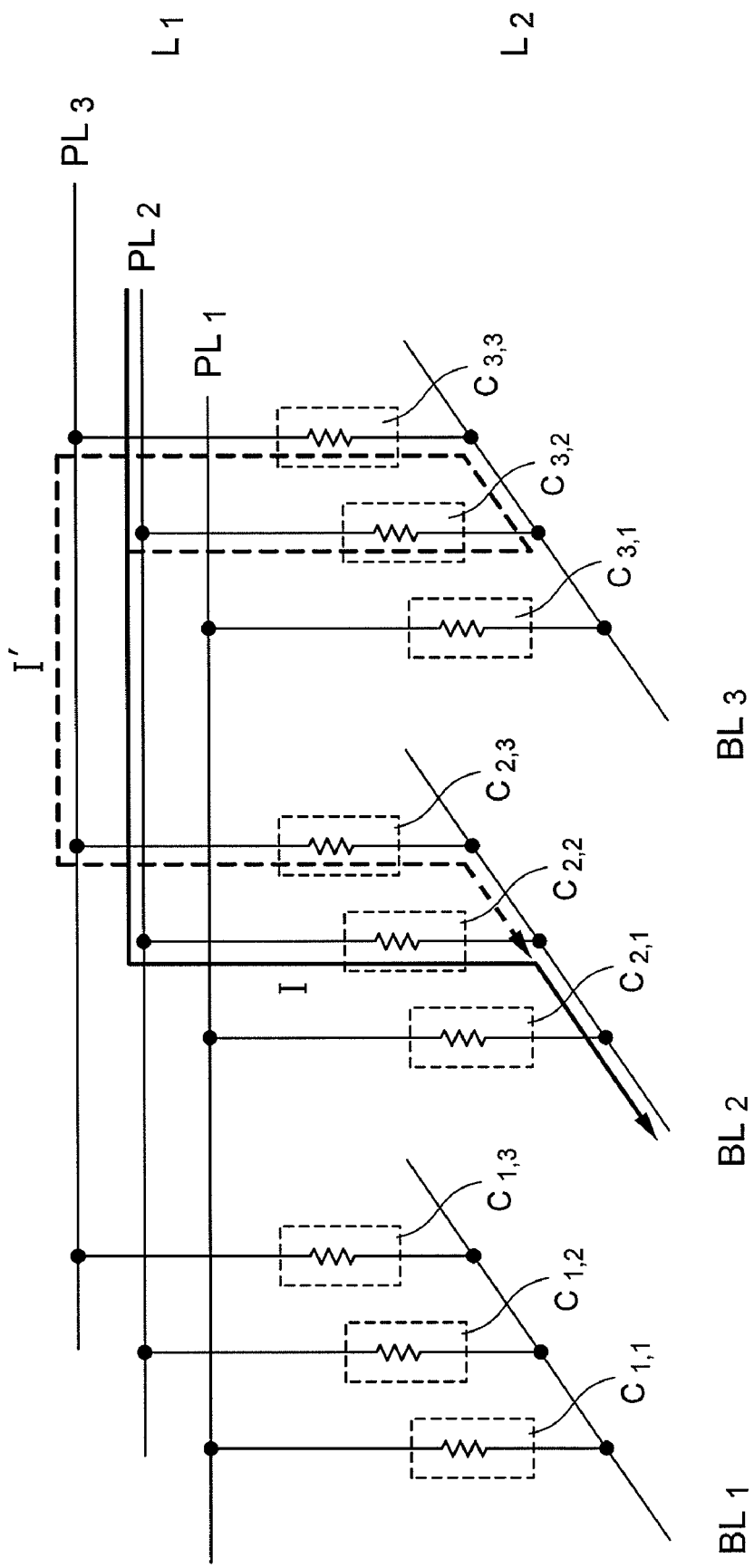
FIG. 2 is a schematic view showing a circuit configuration of a memory of a first comparative example.
Figure 3:
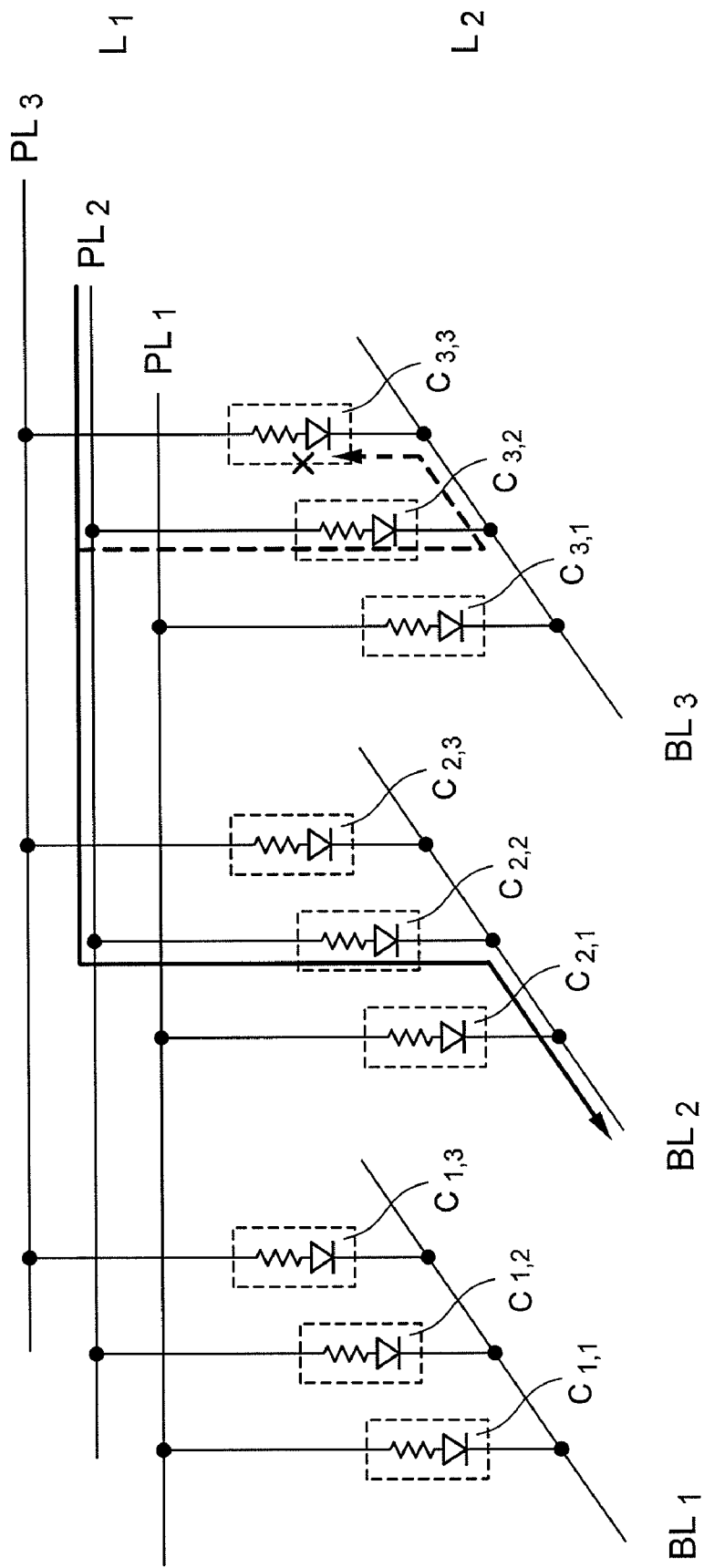
FIG. 3 is a schematic view showing a circuit configuration of a memory of a second comparative example.

Hereinafter, memories of comparative examples will be described. FIG. 2 is a schematic view showing a circuit configuration of a memory of a first comparative example. FIG. 3 is a schematic view showing a circuit configuration of a memory of a second comparative example.

The memory of FIG. 2 is a crosspoint resistor memory. In FIG. 2, each memory cell includes a resistor, but does not include a transistor. Therefore, the memory of FIG. 2 is advantageous in that it has a high probability of realizing high integration. However, the memory of FIG. 2 is defective in that a write current flows also to cells other than a write target cell. FIG. 2 shows how a write current I for the memory cell $C_{2,2}$ partly leaks as a current I'. Therefore, in the crosspoint resistor memory, it is effective to insert a diode to each memory cell as shown in FIG. 3.

Figure 4:
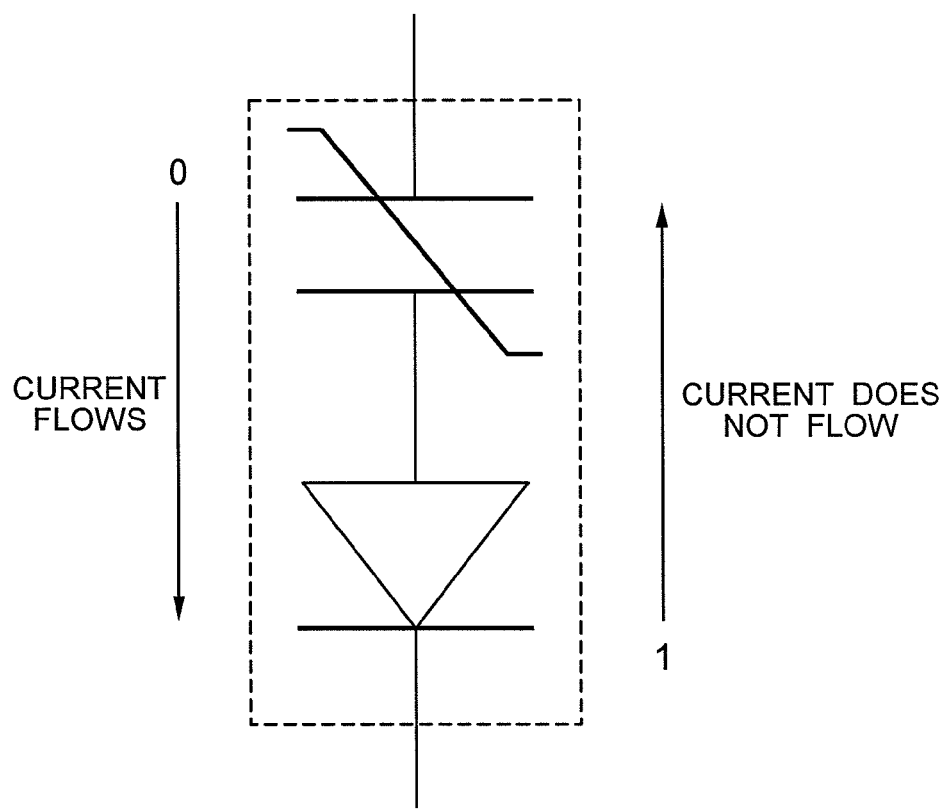
FIG. 4 is a schematic view for explaining a problem of a crosspoint memory.

However, when this method is applied to the ferroelectric memory, a problem arises in that a current to a capacitor can flow only in one direction due to a rectification by the diode. This is not preferred because the ferroelectric memory must reverse the direction of the current flow to the capacitor, depending on whether it writes "0" or "1" as shown in FIG. 4. In FIG. 4, although "0" can be written, "1" cannot be written.

Figure 5:
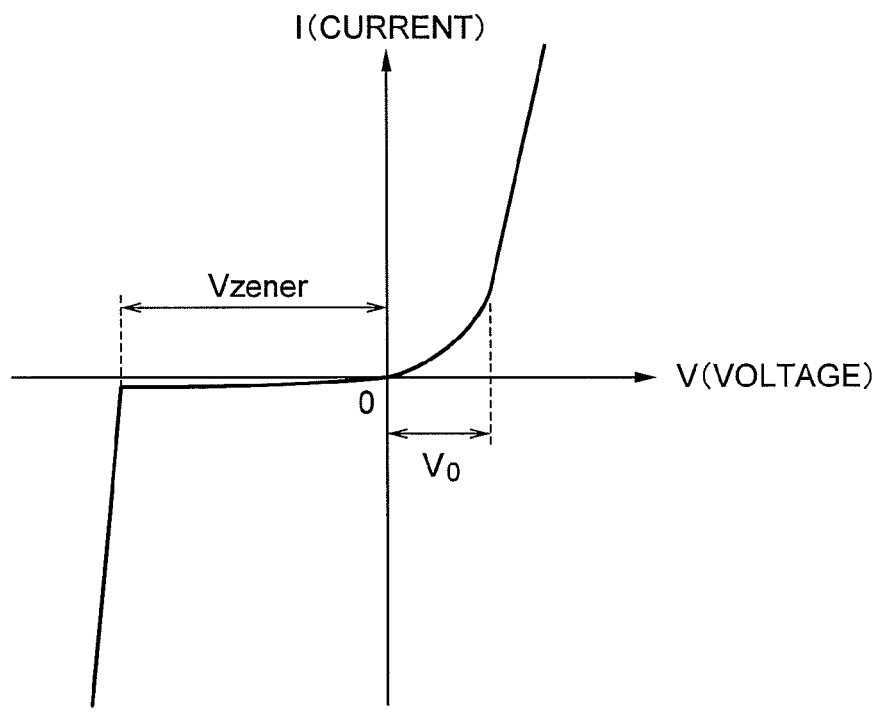
FIG. 5 shows I-V characteristics of a zener diode.

Therefore, in the ferroelectric memory 101 of FIG. 1, a zener diode 132 is inserted to each memory cell 121 instead of an ordinarily diode. FIG. 5 shows the I-V characteristics of the zener diode. In FIG. 5, $V_0$ denotes an on-voltage of the zener diode, and $V_{zener}$ denotes a breakdown voltage (zener voltage) of the zener diode. Further, in FIG. 5, a positive voltage shows a forward voltage, and a negative voltage shows a reverse voltage.

The zener diode has a rectification effect likewise an ordinary diode. Accordingly, the ferroelectric memory 101 of FIG. 1 can prevent the leak of the write current. In addition, a current can flow in the zener diode in a reverse direction by applying it with a reverse voltage larger than its zener voltage. As a result, the ferroelectric memory 101 of FIG. 1 can solve the problem in that a current to a ferroelectric capacitor 131 can flow only in one direction.

As described above, in this embodiment, the crosspoint ferroelectric memory 101 having a high selectivity of the memory cells 121 can be realized by inserting the zener diode 132 to each memory cell. An example of an operation method of the ferroelectric memory 101 of FIG. 1 will be described later.

Figure 6:
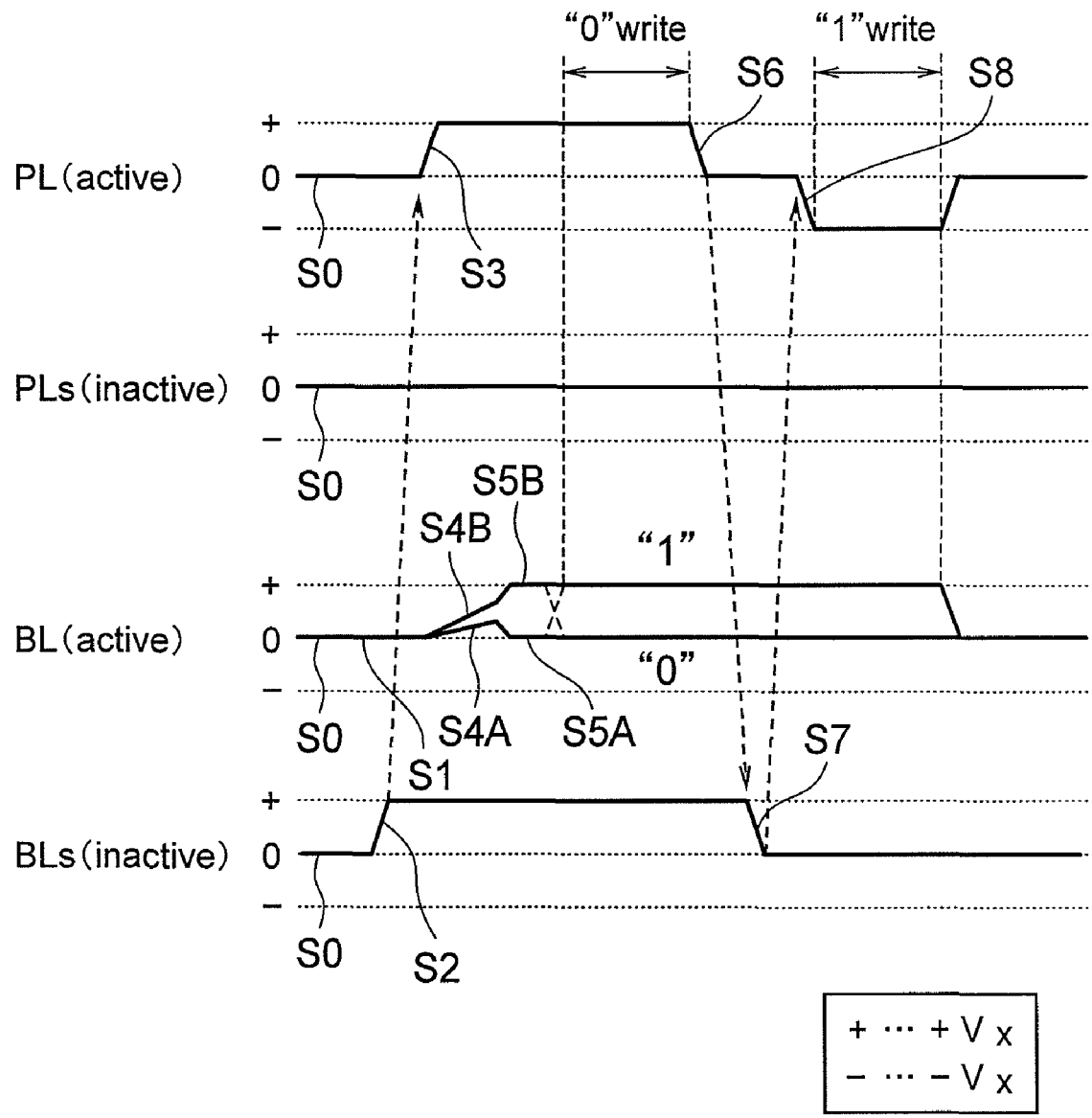
FIG. 6 is a waveform diagram showing an example of an operation of the ferroelectric memory of the first embodiment.

FIG. 6 is a waveform diagram showing an example of an operation of the ferroelectric memory 101 of the first embodiment. FIG. 6 shows how data is read out and written. In the ferroelectric memory 101 of FIG. 1, since data is broken by being read out, the data is written again after it is read out.

FIG. 6 shows waveforms of signals to be supplied to an active PL, inactive PLs, an active BL, and inactive BLs. The active PL and the active BL denote a plateline 111 and a bitline 112 connected to a selected cell, i.e., a cell from which or to which data is to be read out or written. For example, when the selected cell is $C_{2,2}$, the active PL is $PL_2$, the inactive PLs are $PL_1$ and $PL_3$, the active BL is $BL_2$, and the inactive BLs are $BL_1$ and $BL_3$.

Figure 7:
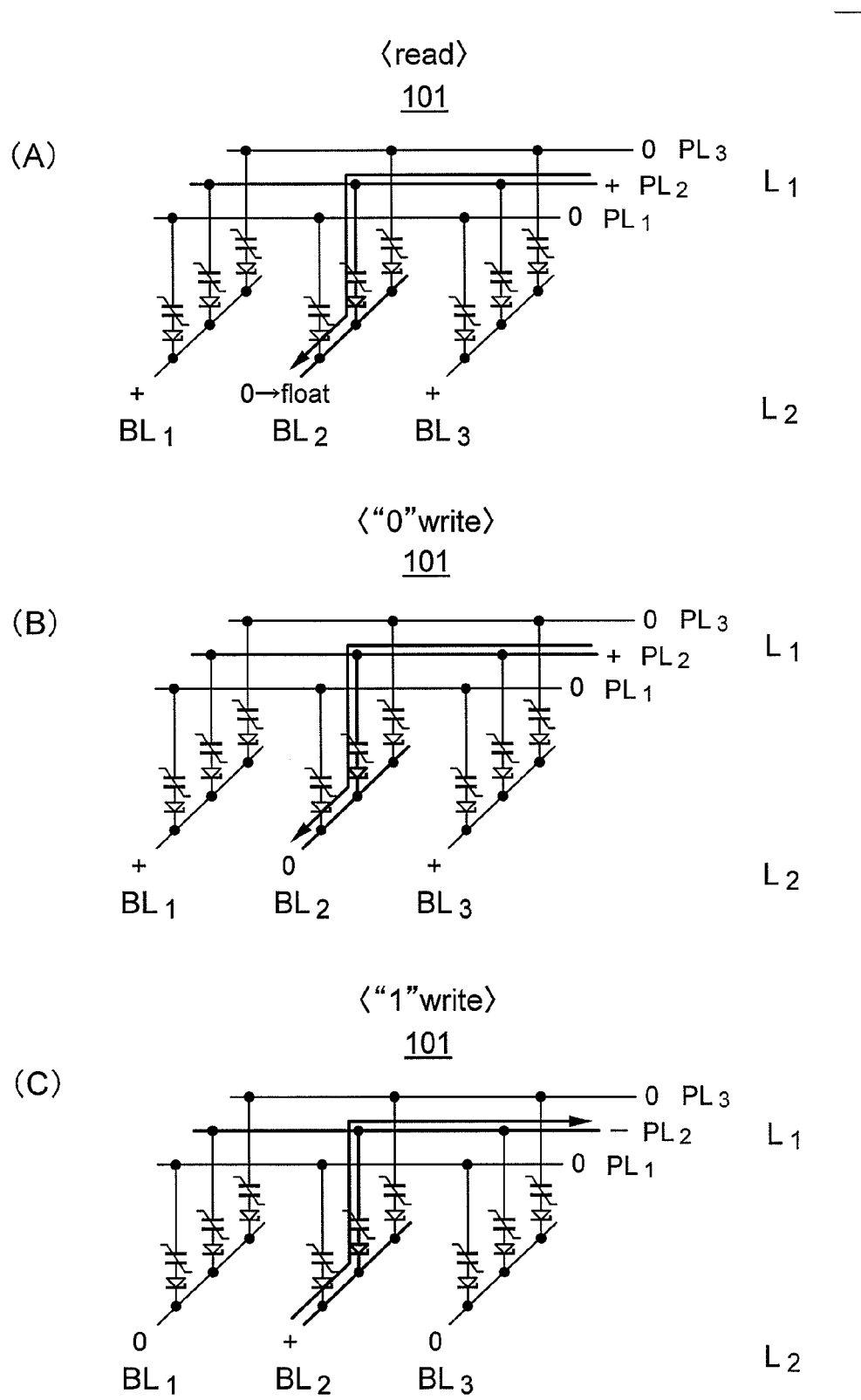
FIG. 7 shows potentials of respective lines in reading out data, writing 0, and writing 1 (first embodiment)

In an initial stage of FIG. 6, the potentials of all of the active PL, inactive PLs, active BL, and inactive BLs are at a zero potential (S0). First, in FIG. 6, the active BL is set to a floating state (S1). Next, the potentials of the inactive BLs are increased to a positive potential $V_X$ (S2). Next, the potential of the active PL is increased to the positive potential $V_X$ (S3). With this operation, data can be read out from the selected cell. FIG. 7(A) shows the potentials of the respective lines at this time.

When the data of the selected cell is "0", the potential of the active BL is slightly increased by a read operation (S4A). The value 0 is an example of a first value of the present invention. In contrast, when the data of the selected cell is "1", the potential of the active BL is increased greatly by the read operation (S4B). The value 1 is an example of a second value of the present invention.

Next, in FIG. 6, a process in the memory switches to a write cycle of the value 0. When the read-out data is "0" or data to be written is "0", the potential of the active BL is decreased to the zero potential (S5A). With this operation, the value 0 is written in the selected cell. FIG. 7(B) shows the potentials of the respective lines at this time. In contrast, when the read-out data is "1" or data to be written is "1", the potential of the active BL is increased to the positive potential $V_X$ (S5B).

As described above, when the value 0 is written, the voltage $V_X$ is applied between the active PL and the active BL in a forward direction of the zener diode 132. With this operation, the forward voltage is applied to the zener diode 132 in the selected cell. In this embodiment, the voltage $V_X$ is set to a value higher than the on-voltage. Thereby, a sufficient current flows in the forward direction of the zener diode 132, and the value 0 is written.

Next, in FIG. 6, the process in the memory switches to a write cycle of the value 1. First, the potential of the active PL is decreased to the zero potential (S6). Next, the potentials of the inactive BLs are decreased to the zero potential (S7). Next, the potential of the active PL is further decreased to a negative potential $-V_X$ (S8).

At this time, when the read-out data or the written data is "0", the potential of the active BL has been set to the zero potential. Accordingly, the voltage $V_X$ is applied to the selected cell in a reverse direction of the zener diode 132. In this embodiment, the voltage $V_X$ is set to a value lower than the zener voltage. Accordingly, when the read-out data or the written data is "0", the value 1 is not written in the selected cell, and the value 0 written in the selected cell is kept.

At this time, when the read-out data or the write data is "1", the potential of the active BL has been set to the positive potential $V_X$. Accordingly, a voltage $2\times V_X$ is applied to the selected cell in the reverse direction of the zener diode 132. In this embodiment, the voltage $2\times V_X$ is set to a value higher than the zener voltage. Thereby, when the read-out data or the write data is "1", a current flows in the reverse direction of the zener diode 132, and the value 1 is written in the selected cell. FIG. 7(C) shows the potentials of the respective lines at this time.

When the value 0 is to be written, the potentials of the active PL, inactive PLs, active BL, and inactive BLs are set to the positive potential $V_X$, the zero potential, the zero potential, and the positive potential $V_X$, respectively. Accordingly, the voltage $V_X$ is applied to the selected cell in the forward direction, and the zero voltage or the voltage $V_X$ in the reverse direction is applied to the non-selected cells. With this operation, the value 0 is written only to the selected cell. This is because the voltage $V_X$ is set to the value lower than the zener voltage in this embodiment.

Further, when the value 1 is to be written, the potentials of the active PL, the inactive PLs, the active BL, and the inactive BLs are set to the negative potential $-V_X$, the zero potential, the positive potential $V_X$, and the zero potential, respectively. Accordingly, the voltage $2\times V_X$ is applied to the selected cell in the reverse direction, and the zero voltage or the voltage $V_X$ in the reverse direction is applied to the non-selected cells. With this operation, the value 1 is written only to the selected cell. This is because the voltage $V_X$ is set to the value lower than the zener voltage, and the voltage $2\times V_X$ is set to the value higher than the zener voltage in this embodiment.

In this embodiment, although the magnitude of the positive potential and the magnitude of the negative potential are set to the same value, they may be set to different values. When the positive potential is set to $V_P$ (>0) and the negative potential is set to $V_N$ (<0), the magnitude of the positive potential $|V_P|$ and the magnitude of the negative potential $|V_N|$ are set to values lower than the zener voltage, because of the same reason as that of the voltage $V_X$. In addition, the magnitude of the difference between the positive potential and the negative potential $|V_P - V_N|$ is set to a value higher than the zener voltage, because of the same reason as that of the voltage $2\times V_X$.

The example of the operation of FIG. 6 can be executed even if the directions of the respective zener diodes 132 are reversed. However, in this case, it is necessary to swap the method of writing the value 0 and the method of writing the value 1 each other, and swap the positive potential and the negative potential each other in the operation of FIG. 6, for example.

As described above, in this embodiment, each of the memory cells 121 includes the ferroelectric capacitor 131 and the zener diode 132. With this arrangement, the cross point ferroelectric memory 101 having a high selectivity of the memory cells 121 can be realized in this embodiment. The crosspoint ferroelectric memory 101 is advantageous in that it has a high probability of realizing high integration.

Ferroelectric memories 101 of second to fourth embodiments will be described below. These embodiments are modifications of the first embodiment, and will be described mainly as to points different from those of the first embodiment.

Second Embodiment

Figure 8:
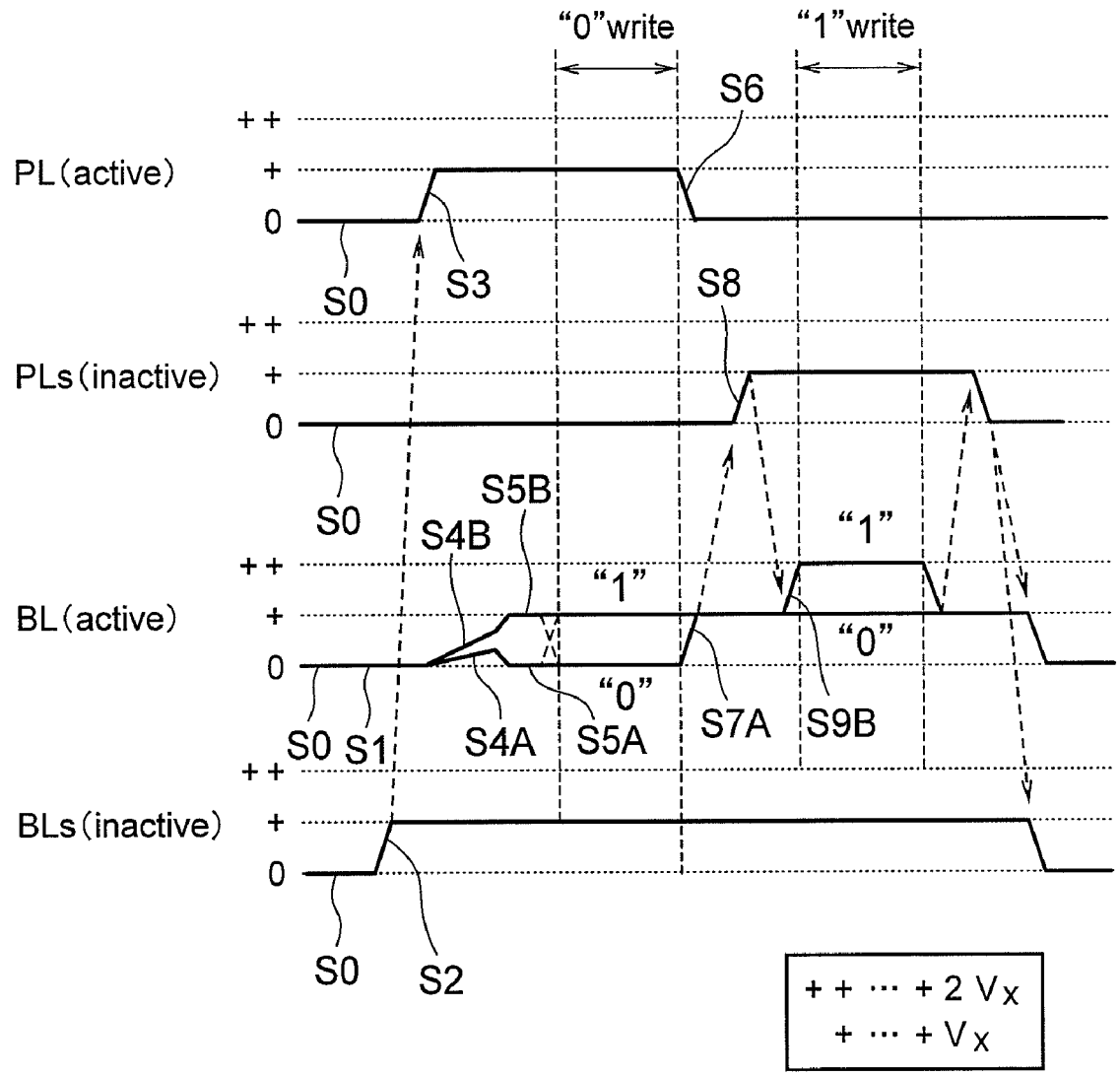
FIG. 8 is a waveform diagram showing an example of an operation of a ferroelectric memory of a second embodiment.

FIG. 8 is a waveform diagram showing an example of an operation of a ferroelectric memory 101 of a second embodiment. FIG. 8 shows how data is read out and written, likewise FIG. 6. Note that the circuit diagram of FIG. 1 is commonly applied to the first and second embodiments.

In the first embodiment, the negative potential is used when the value 1 is written. However, when the negative potential is used, it is necessary to apply a countermeasure to a circuit and a process of the ferroelectric memory 101. If the negative potential is used without the countermeasure, a forward bias is applied to a pn-junction between a p-type substrate (which ordinarily has a zero potential) and an n-MOS transistor, so that a large current flows in the memory. To avoid this problem, a countermeasure such as separation of wells and the like is necessary. However, this complicates a circuit design of the memory 101.

Therefore, in the second embodiment, the value 1 is written without using the negative potential. Specifically, when the value 1 is written, the potentials of the active PL, inactive PLs, active BL, and inactive BLs are set to the zero potential, the positive potential $V_X$, a positive potential $2\times V_X$, and the positive potential $V_X$, respectively. The positive potential $2\times V_X$ is an example of a first positive potential of the present invention, and the positive potential $V_X$ is an example of a second positive potential lower than the first positive potential, of the present invention.

Figure 9:
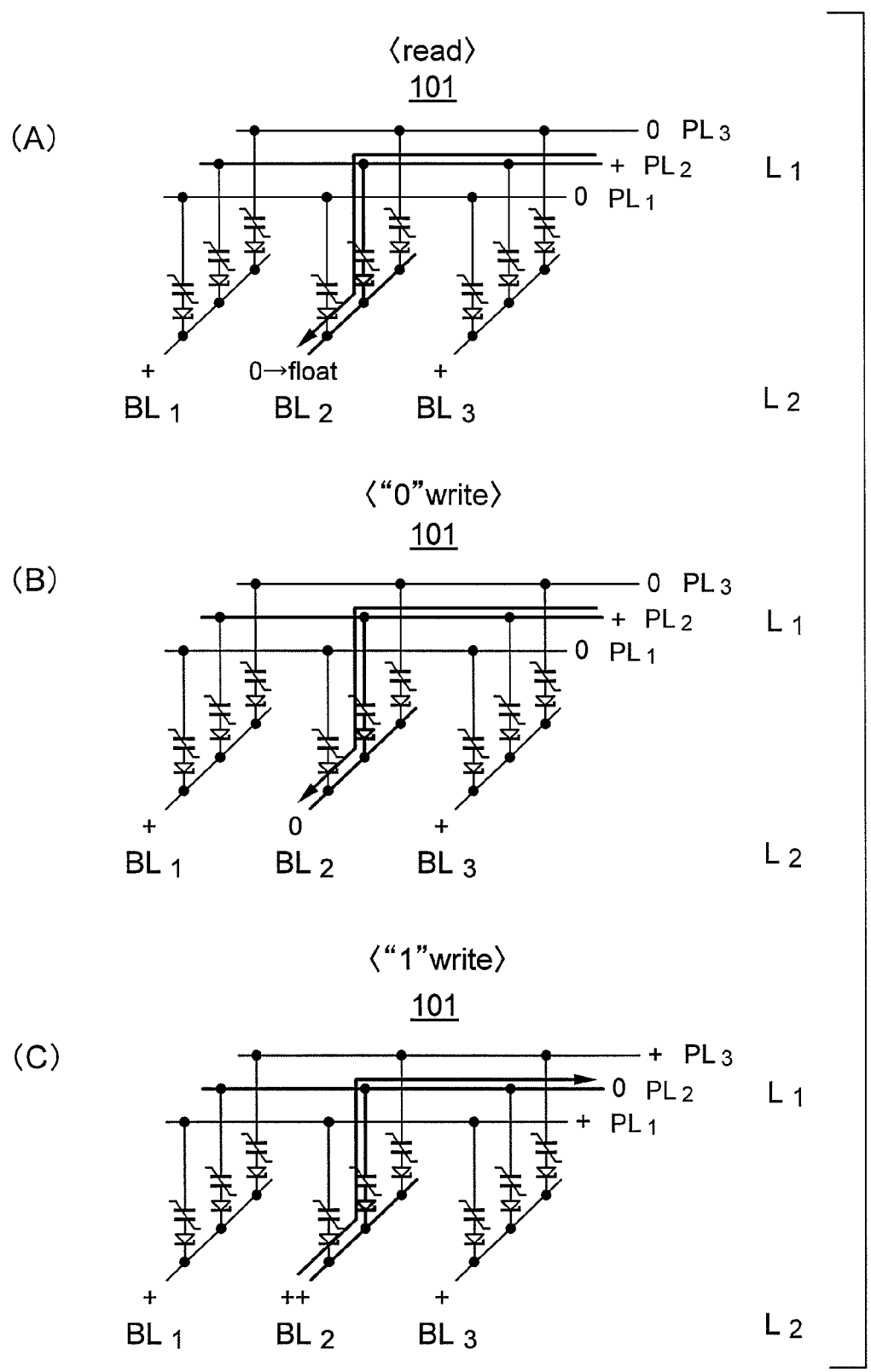
FIG. 9 shows potentials of respective lines in reading out data, writing 0, and writing 1 (second embodiment)

In FIG. 8, processings from S0 to S5A and S5B are executed likewise those of FIG. 6. FIG. 9(A) shows potentials of the respective lines when data is read out. FIG. 9(B) shows the potentials of the respective lines when the value 0 is written. FIGS. 9(A) and 9(B) are the same as FIGS. 7(A) and 7(B), respectively.

Next, in FIG. 8, the process in the memory switches to a write cycle of the value 1. First, the potential of the active PL is decreased to the zero potential (S6). Next, when data read out from or written in the selected cell is "0", the potential of the active BL is increased from the zero potential to the positive potential $V_X$ (S7A). Next, the potential of the inactive PLs is increased to the positive potential $V_X$ (S8). Next, when the data read out from or to be written in the selected cell is "1", the potential of the active BL is increased from the positive potential $V_X$ to the positive potential $2\times V_X$ (S9B).

At this time, when the read-out data or the written data is "0", the potential of the active PL has been set to the zero potential, and the potential of the active BL has been set to the positive potential $V_X$. Accordingly, the voltage $V_X$ is applied to the selected cell in the reverse direction of the zener diode 132. In this embodiment, the voltage $V_X$ is set to a value lower than the zener voltage. Accordingly, when the read-out data or the written data is "0", the value 1 is not written in the selected cell, and the value 0 written in the selected cell is kept.

In contrast, when the read-out data or the write data is "1", the potential of the active PL has been set to the zero potential, and the potential of the active BL has been set to the positive potential $2 \times V_X$. Accordingly, the voltage $2 \times V_X$ is applied to the selected cell in the reverse direction of the zener diode 132. In this embodiment, the voltage $2 \times V_X$ is set to a value higher than the zener voltage likewise the first embodiment. Accordingly, when the read-out data or the write data is "1", a current flows in the reverse direction of the zener diode 132, and the value 1 is written in the selected cell. FIG. 9(C) shows the potentials of the respective lines at this time.

As described above, according to the second embodiment, the value 1 can be written without using the negative potential. With this operation, since the countermeasure for separating the wells is not necessary, the circuit design of the memory 101 does not become complicated. On the contrary, the first embodiment is advantageous in that power consumption is small because the inactive PLs need not be driven.

In this embodiment, although the magnitude of the first positive potential ($2 \times V_X$) is set twice that of the second positive potential ($V_X$), it may be other than twice. When the first positive potential is set to $V_{P1}$ and the second positive potential is set to $V_{P2}$ ($V_{P1} > V_{P2} > 0$), the magnitude of the second positive potential $|V_{P2}|$ and the magnitude of the difference between the first and second positive potentials $|V_{P1} - V_{P2}|$ are set to values smaller than the zener voltage by the same reason as that of the voltage $V_X$. In addition, the magnitude of the first potential $|V_{P1}|$ is set to a value higher than the zener voltage, because of the same reason as that of the voltage $2 \times V_X$.

Third Embodiment

Figure 10:
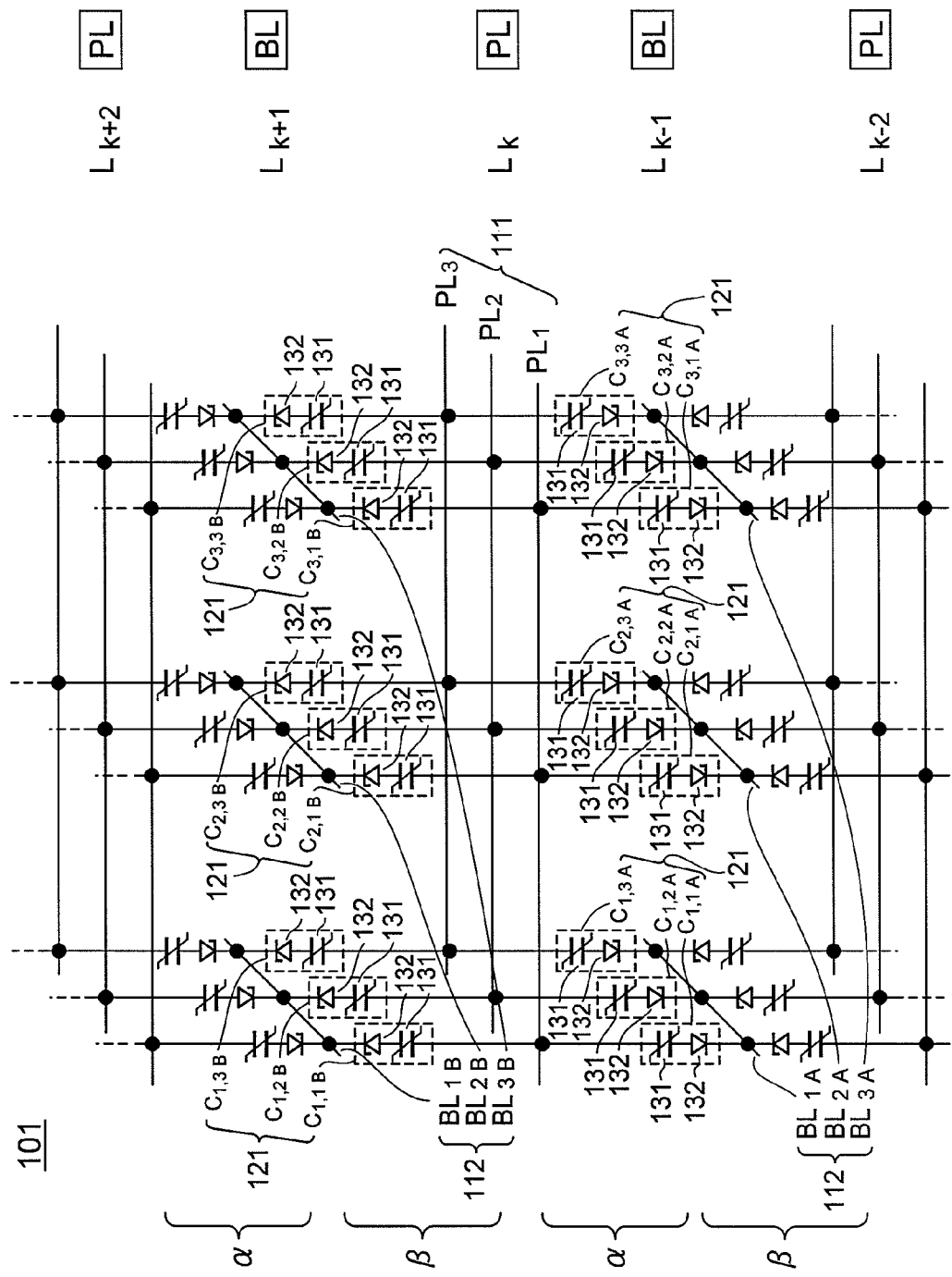
FIG. 10 is a schematic view showing a circuit configuration of a ferroelectric memory of a third embodiment.

FIG. 10 is a schematic view showing a circuit configuration of a ferroelectric memory 101 of a third embodiment.

The ferroelectric memory 101 of FIG. 10 has the circuit configuration in which structures α and structures β are alternately stacked. Each of the structures α has the same circuit configuration as the circuit diagram of FIG. 1. Each of the structures β has a circuit configuration obtained by reversing the circuit diagram of FIG. 1 vertically.

In this way, the ferroelectric memory 101 of FIG. 10 has such a circuit configuration as the ferroelectric memories 101 of FIG. 1 are stacked. In this embodiment, the memory can be more integrated due to such a stack structure.

Further, the ferroelectric memory 101 of FIG. 10 has the circuit configuration in which the structures α and the structures β are alternately stacked, instead of a circuit configuration in which only the structures α are stacked. In this embodiment, such an alternate stack structure allows the structures α and the structures β to share platelines 111 and bitlines 112. Thereby, in this embodiment, the number of the platelines 111 and the bitlines 112 can be more reduced than a case that the ferroelectric memories 101 of FIG. 1 are stacked in the same direction.

The ferroelectric memory 101 of FIG. 10 has three or more interconnect layers. As an example of these interconnect layers, FIG. 10 shows interconnect layers $L_{k-2}$, $L_{k-1}$, $L_k$, $L_{k+1}$, and $L_{k+2}$ (k is an integer).

The circuit configuration of the ferroelectric memory 101 of FIG. 10 will be described below in detail, using the interconnect layers $L_{k-1}$, $L_k$, and $L_{k+1}$ as an example. The interconnect layer $L_k$ is an example of a first interconnect layer of the present invention. The interconnect layer $L_{k-1}$ is an example of a second interconnect layer positioned under the first interconnect layer, of the present invention. The interconnect layer $L_{k+1}$ is an example of a third interconnect layer positioned above the first interconnect layer, of the present invention.

The interconnect layer $L_k$ includes m platelines 111 arranged in this layer $L_k$. FIG. 10 exemplifies three platelines $PL_1$, $PL_2$, and $PL_3$ arranged in the interconnect layer $L_k$.

The interconnect layers $L_{k-1}$ includes n bitlines 112 arranged in this layer $L_{k-1}$. These bitlines 112 are an example of first bitlines of the present invention. FIG. 10 exemplifies three bitlines $BL_{1A}$, $BL_{2A}$, and $BL_{3A}$ arranged in the interconnect layer $L_{k-1}$.

The interconnect layers $L_{k+1}$ includes n bitlines 112 arranged in this layer $L_{k+1}$. These bitlines 112 are an example of second bitlines of the present invention. FIG. 10 exemplifies three bitlines $BL_{1B}$, $BL_{2B}$, and $BL_{3B}$ arranged in the interconnect layer $L_{k+1}$.

Under the interconnect layer $L_k$, m×n memory cells 121 are arranged at m×n intersection points of the m platelines 111 of the interconnect layer $L_k$ and the n bitlines 112 of the interconnect layer $L_{k-1}$. FIG. 10 exemplifies 3×3 memory cells $C_{1,1A}$ to $C_{3,3A}$ arranged at 3×3 intersection points of the three platelines $PL_1$ to $PL_3$ and the three bitlines $BL_{1A}$ to $BL_{3A}$.

Above the interconnect layer $L_k$, m×n memory cells 121 are arranged at m×n intersection points of the m platelines 111 of the interconnect layer $L_k$ and the n bitlines 112 of the interconnect layer $L_{k-1}$. FIG. 10 exemplifies 3×3 memory cells $C_{1,1B}$ to $C_{3,3B}$ arranged at 3×3 intersection points of the three platelines $PL_1$ to $PL_3$ and the three bitlines $BL_{1B}$ to $BL_{3B}$.

In this way, in FIG. 10, the 2×m×n memory cells 121 are arranged between the interconnect layers $L_k$ and $L_{k-1}$ and between the interconnect layers $L_k$ and $L_{k+1}$.

Each memory cell 121 includes a ferroelectric capacitor 131 and a zener diode 132. In each of the 2×m×n memory cells 121, the ferroelectric capacitor 131 and the zener diode 132 are connected in series between any one of the m platelines 111 and any one of the 2×n bitlines 112.

In each memory cell 121, the ferroelectric capacitor 131 is arranged in the plateline 111 side, and the zener diode 132 is arranged in the bitline 112 side. Each ferroelectric capacitor 131 has one electrode connected to the corresponding plateline 111, and the other electrode connected to the corresponding zener diode 132. Each zener diode 132 has an anode connected to the corresponding ferroelectric capacitor 131, and a cathode connected to the corresponding bitline 112. The positional relation between the ferroelectric capacitor 131 and the zener diode 132 and the direction of the zener diode 132 may be opposite to those of FIG. 10.

Figure 11:
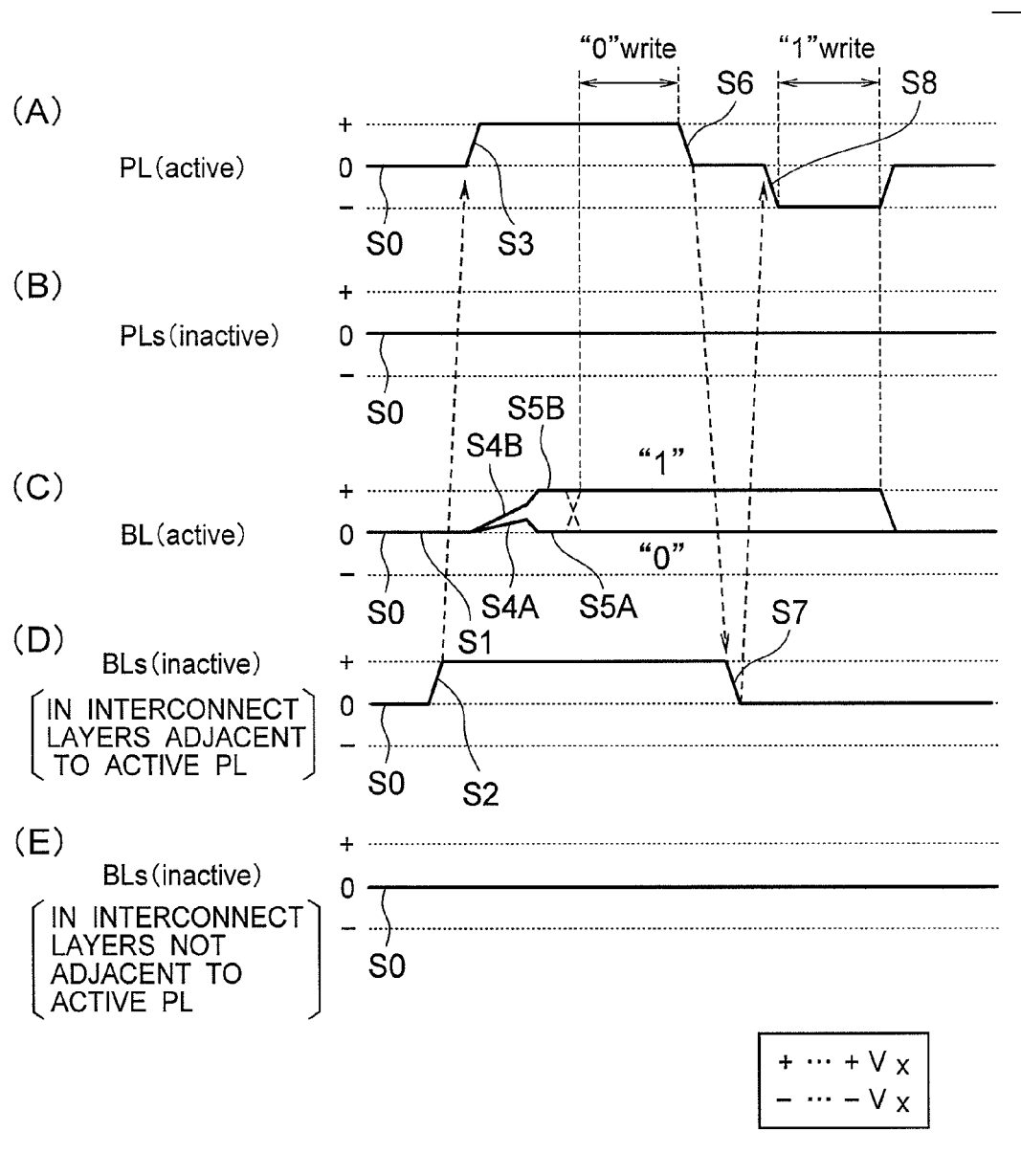
FIG. 11 is a waveform diagram showing an example of an operation of the ferroelectric memory of the third embodiment.

FIG. 11 is a waveform diagram showing an example of an operation of the ferroelectric memory 101 of FIG. 10. FIG. 11 shows how data is read out and written likewise FIG. 6.

FIG. 11 shows waveforms of signals supplied to the respective lines. FIGS. 11(A) and 11(B) show the waveforms of the signals for an active PL and inactive PLs. FIGS. 11(C), 11(D), and 11(E) show the waveforms of the signals for an active BL, inactive BLs in interconnect layers adjacent to the active PL, and inactive BLs in interconnect layers not adjacent to the active PL.

For example, when the selected cell is $C_{2,2,4}$, the active PL is $PL_2$, and the inactive PLs are the platelines 111 other than $PL_2$. Also, the active BL is $BL_{2,4}$. Also, the inactive BLs in the interconnect layers adjacent to the active PL are the bitlines 112 in $L_{k-1}$ and $L_{k+1}$ (excluding $BL_{2,4}$), and the inactive BLs in the interconnect layers not adjacent to the active PL are the bitlines 112 in the interconnect layers other than $L_{k-1}$ and $L_{k+1}$.

As can be found by comparing FIG. 11 with FIG. 6, the waveforms of the signals for the active PL (FIG. 11(A)), the inactive PLs (FIG. 11(B)), the active BL (FIG. 11(C)), and the inactive BLs in the interconnect layers adjacent to the active PL (FIG. 11(D)) of FIG. 11 are the same as those for the active PL, the inactive PLs, the active BL, and the inactive BLs of FIG. 6. Further, the waveform of the signal for the inactive BLs in the interconnect layers not adjacent to the active PL (FIG. 11(E)) of FIG. 11 is at the zero potential at all times. Further, the waveform of the signal for the inactive PLs (FIG. 11(B)) of FIG. 11 is also at the zero potential at all times.

It can be found from what has been described above that the operation shown in FIG. 11 is the same as that shown in FIG. 6. This means that the ferroelectric memory 101 of the third embodiment can be driven by the same method as that of the ferroelectric memory 101 of the first embodiment. Further, in the operation shown in FIG. 11, it can be found that the platelines 111 other than the active PL, and the bitlines 112 in the interconnect layers not adjacent to the active PL need not be driven. This means that even, if the structures α and the structures β are stacked to N layers, power consumption in the memory of the third embodiment does not become N times. As described above, in the third embodiment, a stack memory having good power efficiency can be realized.

Figure 12:
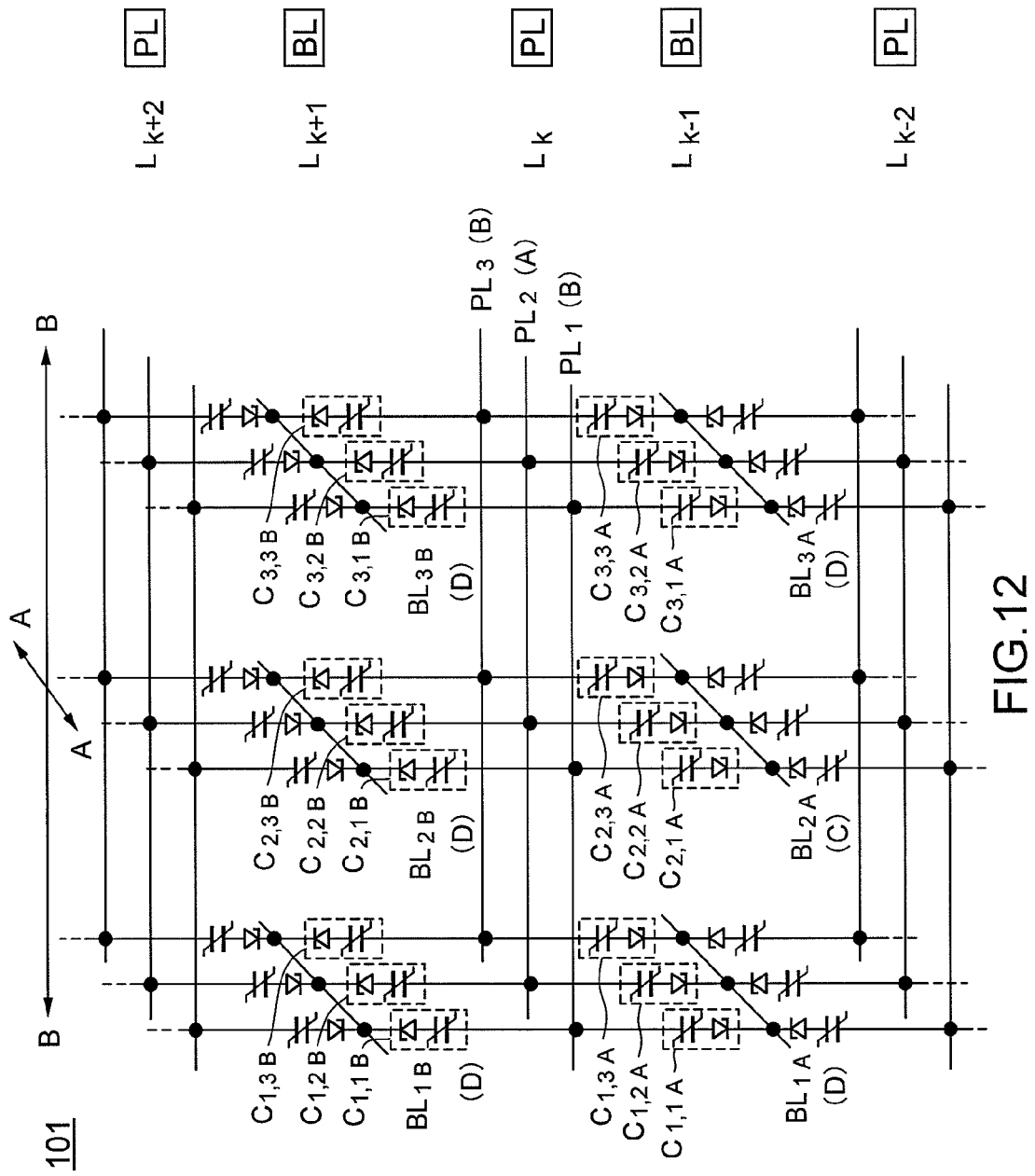
FIG. 12 shows potentials of respective lines in the example of the operation of FIG. 11.

FIG. 12 shows potentials of the respective lines in the example of the operation of FIG. 11. When the selected cell is $C_{2,2,4}$, the potentials as shown in FIG. 12 are applied to the m platelines 111 and to the 2×n bitlines 112. That is, the potential of FIG. 11(A) is applied to $PL_2$, and the potential of FIG. 11(B) is applied to the other (m−1) platelines 111. Further, the potential of FIG. 11(C) is applied to $BL_{2,4}$, and the potential of FIG. 11(D) is applied to the other (2×n−1) platelines 112.

Figure 13:
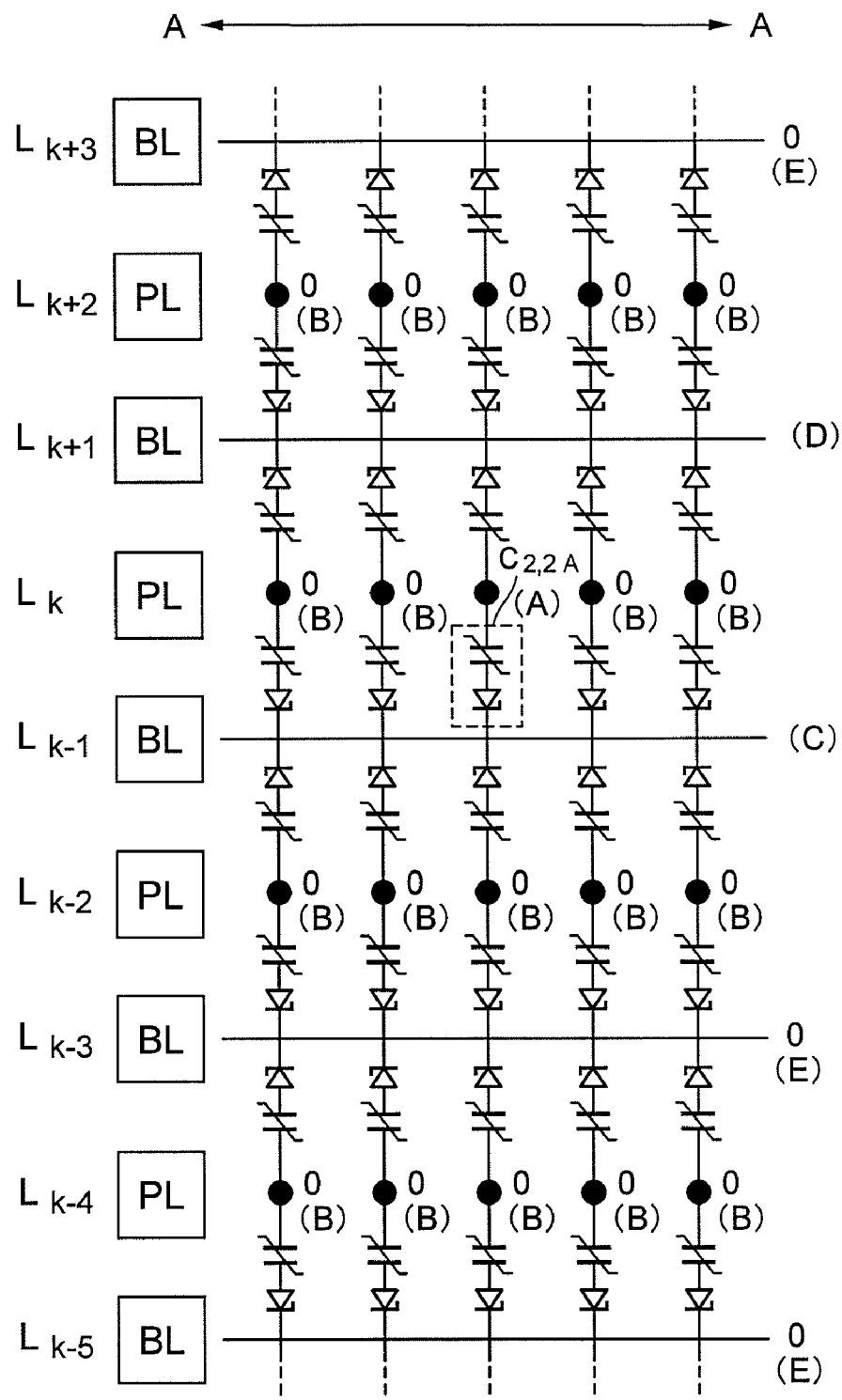
FIG. 13 shows potentials of the respective lines in an A-A cross section of FIG. 12.
Figure 14:
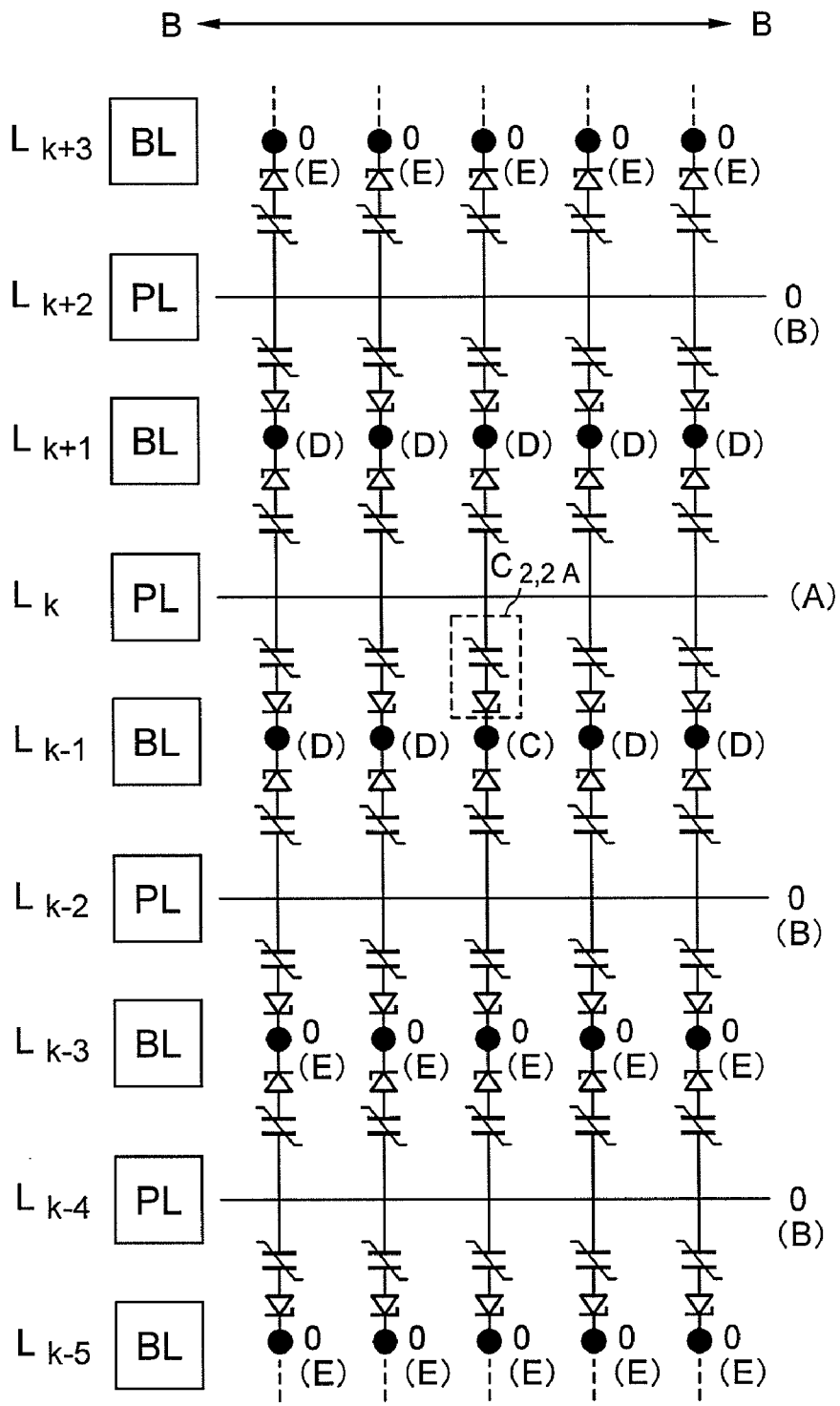
FIG. 14 shows potentials of the respective lines in a B-B cross section of FIG. 12.

FIGS. 13 and 14 show the potentials of the respective lines in the example of the operation of FIG. 11. FIG. 13 shows the potentials of the respective lines in an A-A cross section of FIG. 12. FIG. 14 shows the potentials of the respective lines in a B-B cross section of FIG. 12. Symbols "A" to "E" of the respective lines show types of signals (FIGS. 11(A) to 11(E)) applied to the respective lines. It can be understood from these figures that even if the structures α and the structures β are stacked to the N layers, the power consumption in the memory does not become N times.

Figures 15, 16:
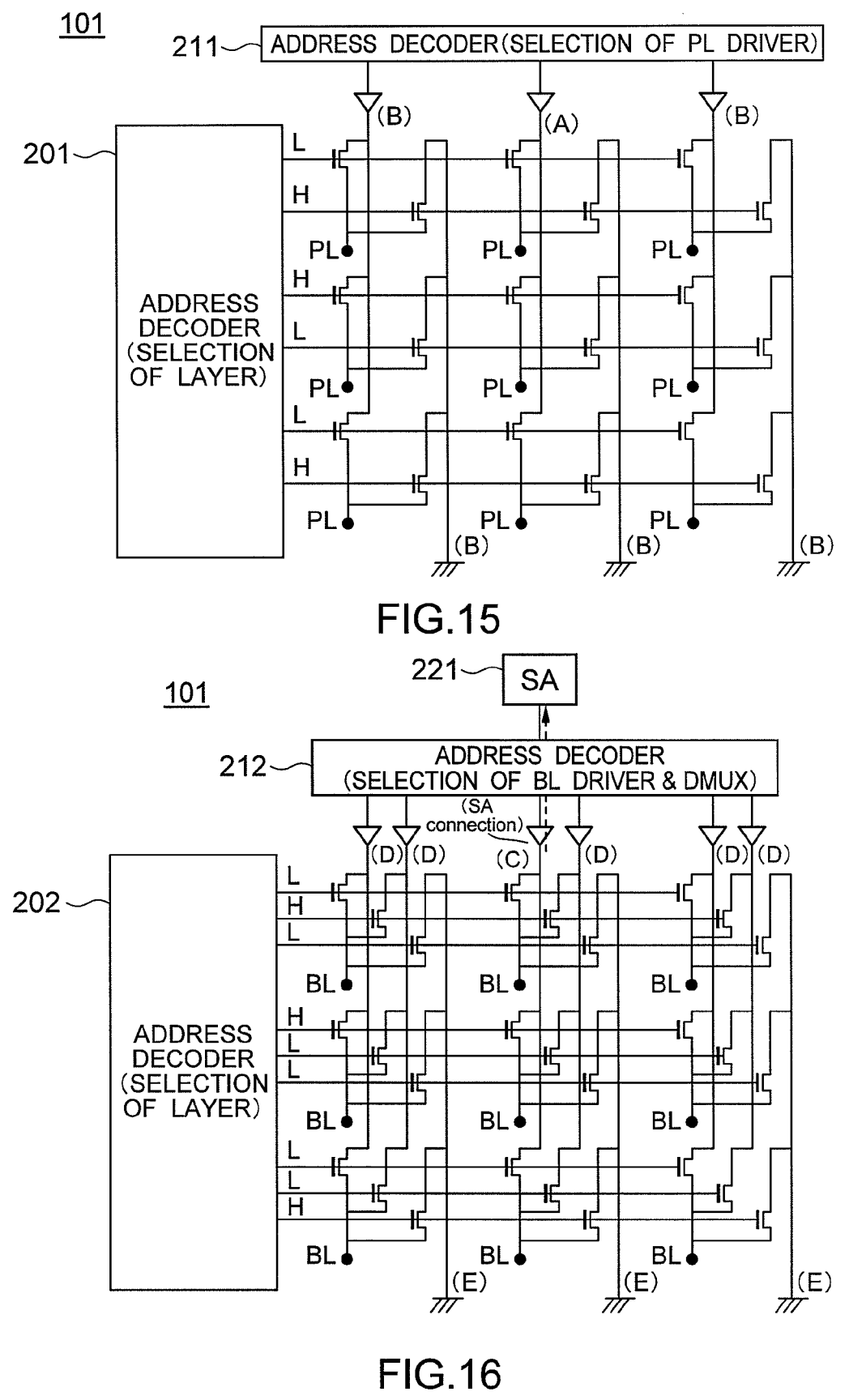

FIGS. 15 and 16 show circuit diagrams of peripheral circuits of the ferroelectric memory 101 of this embodiment. FIGS. 15 and 16 are the circuit diagrams corresponding to those of FIGS. 13 and 14, respectively. As shown in FIGS. 15 and 16, the ferroelectric memory 101 of this embodiment has address decoders 201 and 202 for selecting an interconnect layer, an address decoder 211 for the platelines 111, an address decoder 212 for the bitlines 112, and a sense amplifier 221 for reading out data from a selected cell. The address decoders 201 and 202 are provided for the selection of the interconnect layer including the platelines 111, and the selection of the interconnect layer including the bitlines 112, respectively.

The address decoder 211 for the platelines 111 is configured to generate the signals of FIGS. 11(A) and 11(B) to drive the platelines 111. The decoder 211 selects a driver of a plateline 111 to drive the plateline 111. On the other hand, the address decoder 212 for the bitlines 112 is configured to generate the signals of FIGS. 11(C), 11(D), and 11(E) to drive the bitlines 112. The decoder 212 selects a driver of a bitline 112 to drive the bitline 112.

The sense amplifier 221 is configured to read out data stored in the selected cell by detecting a change of the potential of the bitlines 112 and amplifying the potential. When the sense amplifier 221 is to detect the potential of a bitline 112, the address decoder 212 sets an output of the driver to high impedance, and places the bitline 112 in a floating state. Then, the sense amplifier 221 is connected to the bitline 112, and the potential of the bitline 112 is detected (FIG. 16).

Note that the ferroelectric memory 101 of the first embodiment can be also driven by the peripheral circuits shown in FIGS. 15 and 16.

As described above, the third embodiment provides the ferroelectric memory 101 having the circuit configuration obtained by stacking the ferroelectric memories 101 of the first embodiment. Thereby, in the third embodiment, the cross-spoint ferroelectric memory 101 can be further integrated.

Fourth Embodiment

Figure 17:
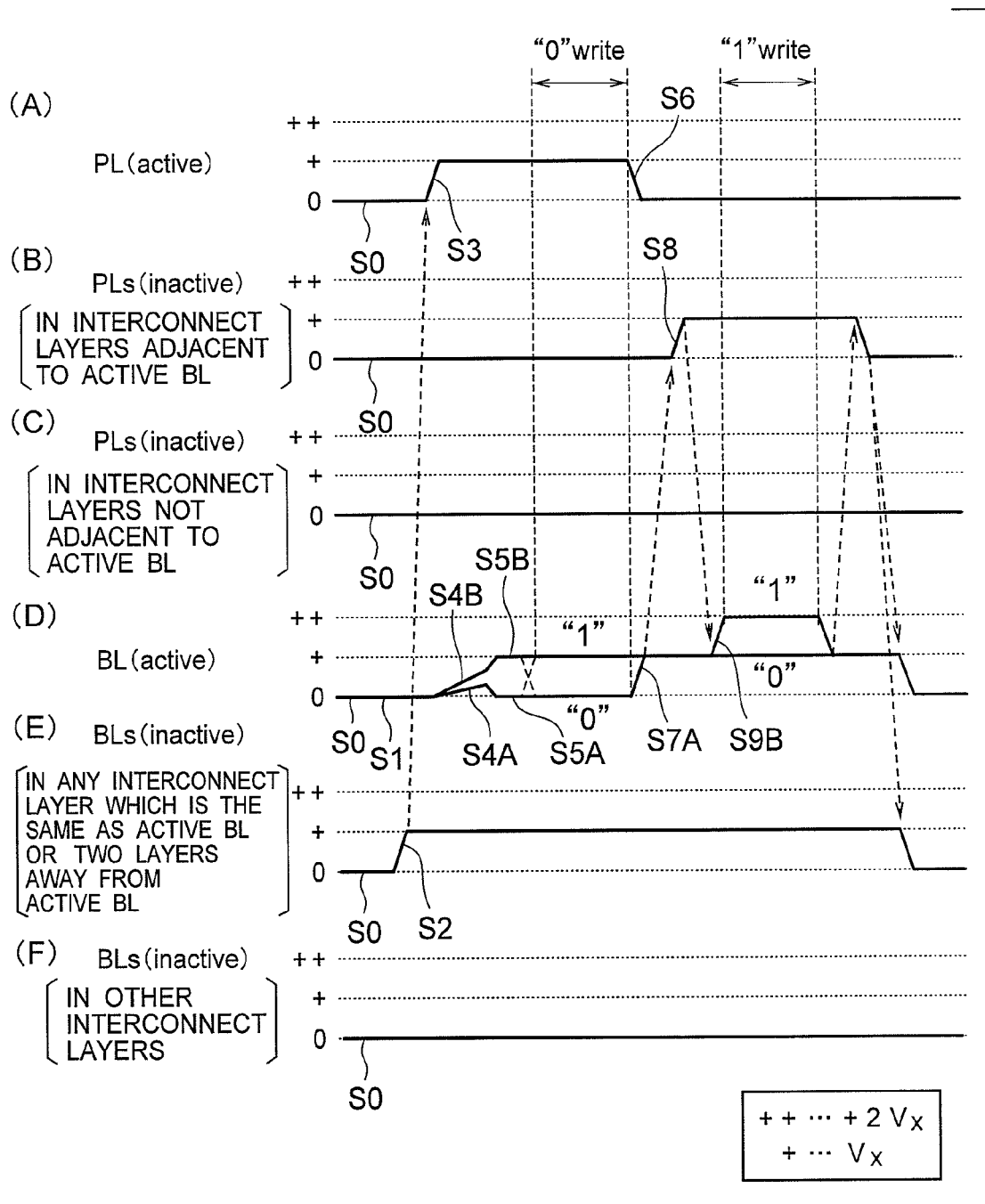
FIG. 17 is a waveform diagram showing an example of an operation of a ferroelectric memory of a fourth embodiment.

FIG. 17 is a waveform diagram showing an example of an operation of a ferroelectric memory 101 of a fourth embodiment. FIG. 17 shows how data is read out and written likewise FIG. 11. Note that the circuit diagram of FIG. 10 is commonly applied to the third and fourth embodiments.

In the third embodiment, the negative potential is used when a value 1 is written, likewise the first embodiment. However, when the negative potential is used, it is necessary to apply a countermeasure to a circuit and a process of the ferroelectric memory 101 as described above. Therefore, in the fourth embodiment, the value 1 is written without using the negative potential likewise the second embodiment.

FIG. 17 shows waveforms of signals supplied to the respective lines. FIGS. 17(A), 17(B), and 17(C) show the waveforms of the signals for an active PL, inactive PLs in interconnect layers adjacent to an active BL, and inactive PLs in interconnect layers not adjacent to the active BL. FIGS. 17(D), 17(E), and 17(F) show the waveforms of the signals for the active BL, inactive BLs in the same interconnect layer as the active BL or in interconnect layers two layers away from the active BL, and inactive BLs in the other interconnect layers.

For example, when the selected cell is $C_{2,2,4}$, the active PL is $PL_2$. Also, the inactive PLs in the interconnect layers adjacent to the active BL are the platelines 111 in $L_k$ and $L_{k-2}$ (excluding $PL_2$), and the inactive PLs in the interconnect layers not adjacent to the active BL is the platelines 111 in the interconnect lines other than $L_k$ and $L_{k-2}$. On the other hand, the active BL is $BL_{2,4}$. Also, the inactive BLs in the same interconnect layer as the active BL or in the interconnect layers two layers away from the active BL are the bitlines 112 in $L_{k-3}$, $L_{k-1}$, and $L_{k+1}$ (excluding $BL_{2,4}$), and the inactive BLs in the other interconnect layers are the bitlines 112 in the interconnect layers other than $L_{k-3}$, $L_{k-1}$, and $L_{k+1}$.

As can be found by comparing FIG. 17 with FIG. 8, the waveforms of the signals for the active PL (FIG. 17(A)), the inactive PLs in the interconnect layers adjacent to the active BL (FIG. 17(B)), the active BL (FIG. 17(D)), and the inactive BLs in the same interconnect layer as the active BL or in the interconnect layers two layers away from the active BL (FIG.

17(E)) of FIG. 17 are the same as the waveforms of the signals for the active PL, the inactive PLs, the active BL, and the inactive BLs of FIG. 8. Further, the waveform of the signal for the inactive BLs outside the interconnect layers adjacent to the active BL (FIG. 17(C)) of FIG. 17 is at the zero potential at all times. Further, the waveform of the signal for the inactive BLs outside the same interconnect layer as the active BL and the interconnect layers two layers away from the active BL (FIG. 17(F)) of FIG. 17 is at the zero potential at all times.

It can be found from what has been described above that the operation shown in FIG. 17 is the same as that shown in FIG. 8. This means that the ferroelectric memory 101 of the fourth embodiment can be driven by the same method as that of the ferroelectric memory 101 of the second embodiment. Further, it can be found that, in the operation shown in FIG. 17, the platelines 111 outside of the interconnect layers adjacent to the active BL, and the bitlines 112 outside of the same interconnect layer as the active BL and the interconnect layers two layers away from the active BL need not be driven. This means that even if the structures α and the structures β are stacked to N layers, power consumption in the memory of the fourth embodiment does not become N times. As described above, in the fourth embodiment, a stack memory having good power efficiency can be realized likewise the third embodiment.

Figure 18:
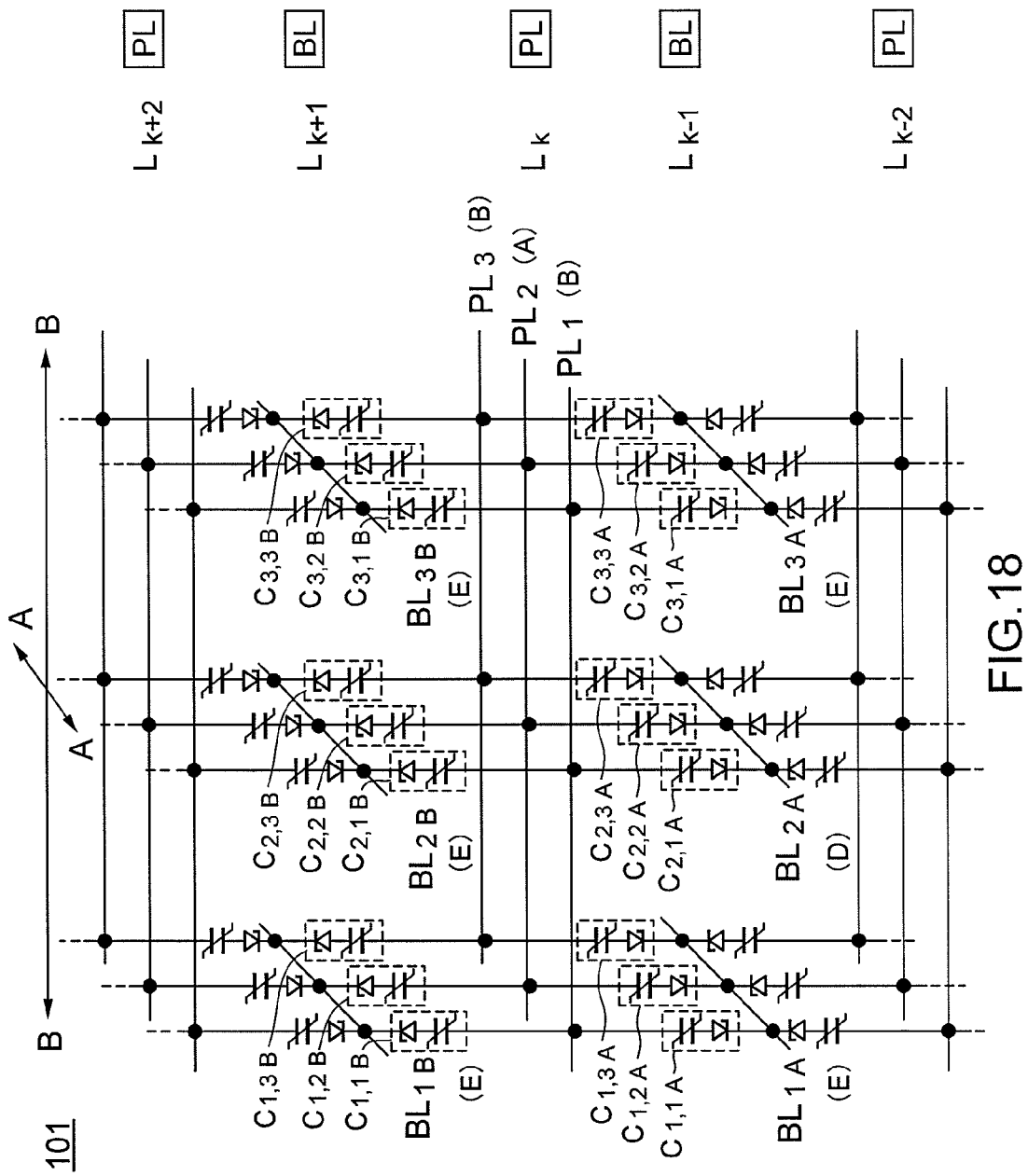
FIG. 18 shows potentials of respective lines in the example of the operation of FIG. 17.

FIG. 18 shows potentials of the respective lines in the example of the operation of FIG. 17. When the selected cell is $C_{2,2,4}$, the potentials as shown in FIG. 18 are applied to the m platelines 111 and the 2×n bitlines 112. That is, the potential of FIG. 17(A) is applied to $PL_2$, and the potential of FIG. 17(B) is applied to the other (m−1) platelines 111. Further, the potential of FIG. 17(D) is applied to $BL_{2,4}$, and the potential of FIG. 17(E) is applied to the other (2×n−1) platelines 112.

Figure 19:
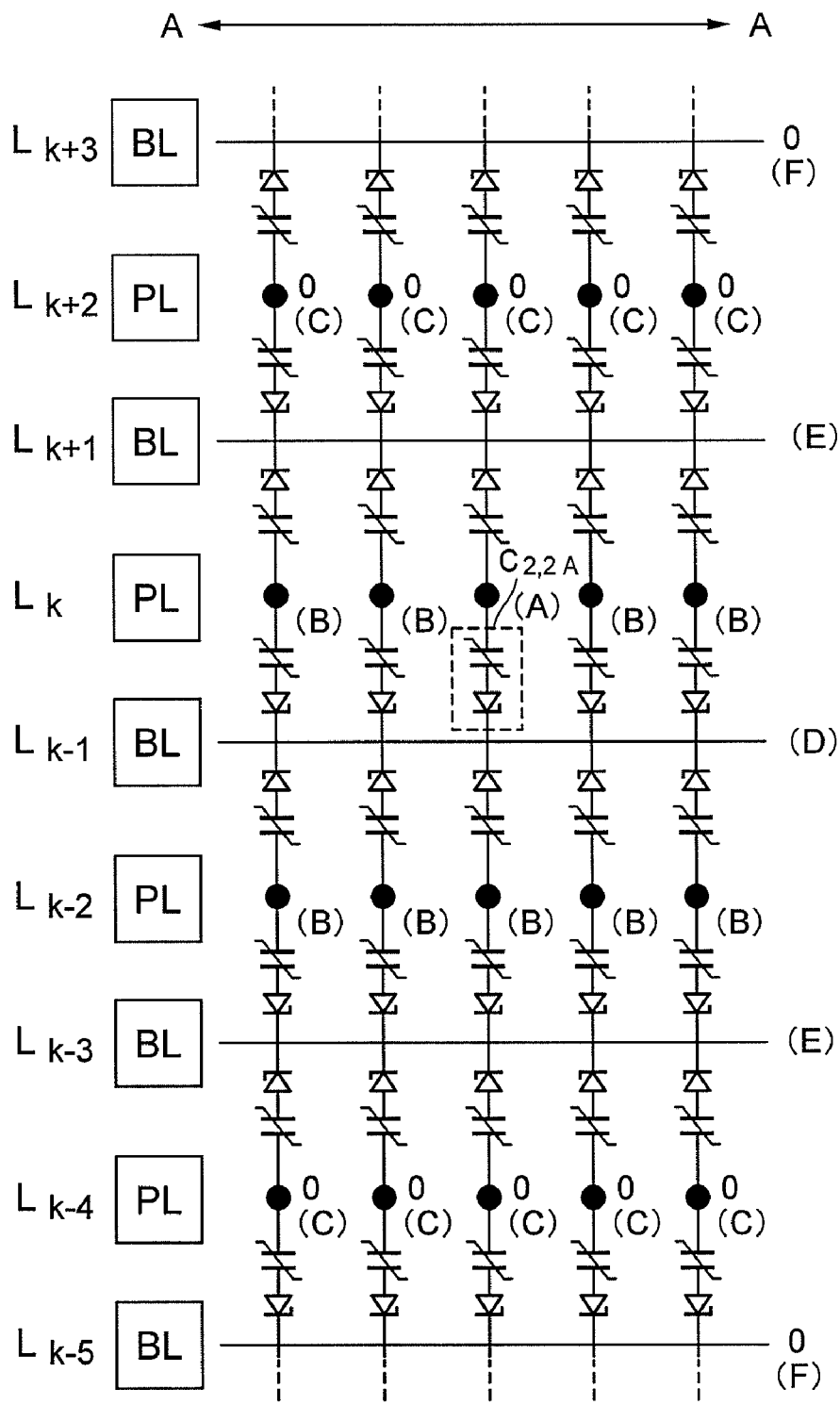
FIG. 19 shows potentials of the respective lines in an A-A cross section of FIG. 18.
Figure 20:
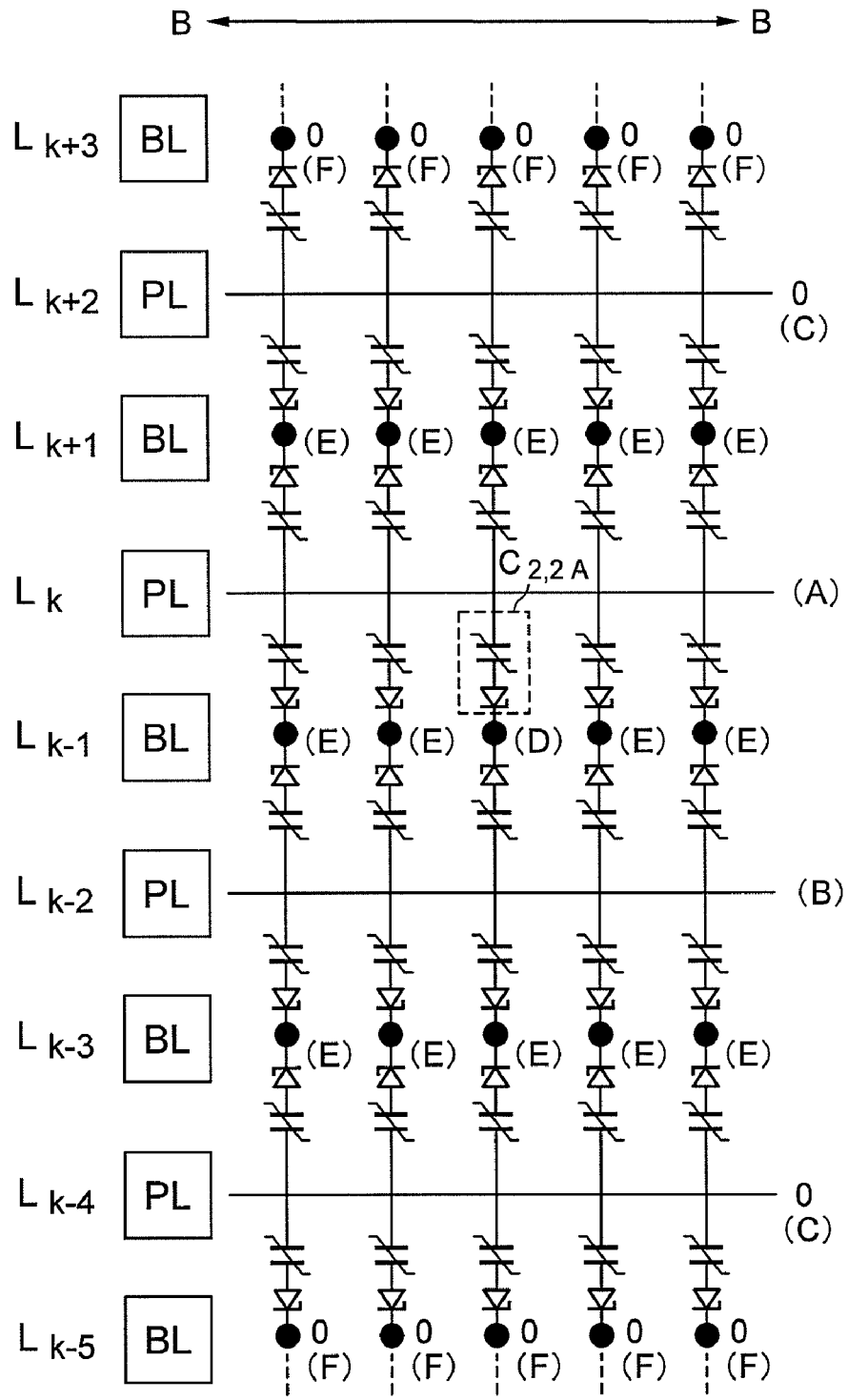
FIG. 20 shows potentials of the respective lines in a B-B cross section of FIG. 18.

FIGS. 19 and 20 further show the potentials of the respective lines in the example of the operation of FIG. 17. FIG. 19 shows the potentials of the respective lines in an A-A cross section of FIG. 18. FIG. 20 shows the potentials of the respective lines in a B-B cross section of FIG. 19. Symbols "A" to "F" of the respective lines show types of signals (FIGS. 17(A) to 17(F)) applied to the respective lines. It can be understood from these figures that even if the structures α and the structures β are stacked to the N layers, the power consumption in the memory does not become N times.

Figure 21:
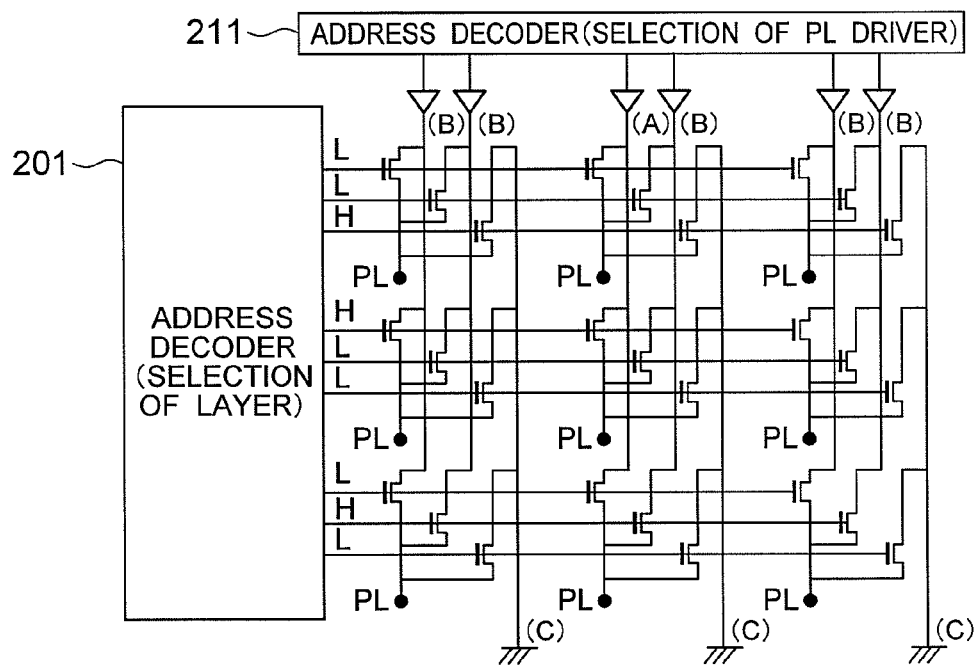
FIG. 21 is a circuit diagram of a peripheral circuit of the ferroelectric memory of the fourth embodiment.
Figure 22:
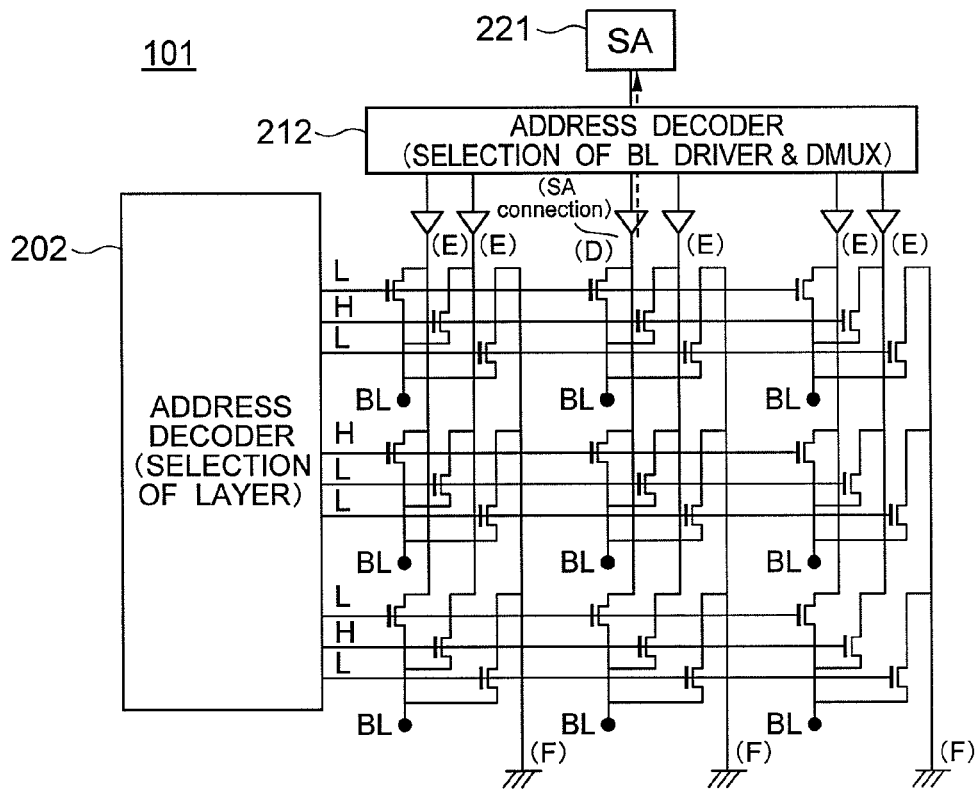
FIG. 22 is a circuit diagram of a peripheral circuit of the ferroelectric memory of the fourth embodiment.

FIGS. 21 and 22 show circuit diagrams of peripheral circuits of the ferroelectric memory 101 of this embodiment. FIGS. 21 and 22 show the circuit diagrams corresponding to those of FIGS. 19 and 20, respectively. As shown in FIGS. 21 and 22, the ferroelectric memory 101 of this embodiment has address decoders 201 and 202 for selecting an interconnect layer, an address decoder 211 for the platelines 111, an address decoder 212 for the bitlines 112, and a sense amplifier 221 for reading out data from a selected cell. The address decoders 201 and 202 are provided for the selection of the interconnect layer including the platelines 111, and the selection of the interconnect layer including the bitlines 112, respectively.

The address decoder 211 for the platelines 111 is configured to generate the signals of FIGS. 17(A), 17(B), and 17(C) to drive the platelines 111. The decoder 211 selects a driver of a plateline 111 to drive the plateline 111. On the other hand, the address decoder 212 for the bitlines 112 is configured to generate the signals of FIGS. 17(D), 17(E), and 17(F) to drive the bitlines 112. The decoder 212 selects a driver of a bitline 112 to drive the bitline 112.

The sense amplifier 221 is configured to read out data stored in the selected cell by detecting a change of the potential of the bitlines 112 and amplifying the potential. When the sense amplifier 221 is to detect the potential of a bitline 112, the address decoder 212 sets an output of the driver to high impedance, and places the bitline 112 in a floating state. Then, the sense amplifier 221 is connected to the bitline 112, and the potential of the bitline 112 is detected (FIG. 22).

Note that the ferroelectric memory 101 of the second embodiment can be also driven by the peripheral circuits shown in FIGS. 21 and 22.

As described above, the fourth embodiment provides the ferroelectric memory 101 having a circuit configuration obtained by stacking the ferroelectric memories 101 of the second embodiment. Thereby, in the fourth embodiment, the crosspoint ferroelectric memory 101 can be further integrated. Further, according to the fourth embodiment, the value 1 can be written without using the negative potential, likewise the second embodiment. With this operation, since a countermeasure such as separation of wells and the like is not necessary, a circuit design of the memory does not become complicated.

As described above, according to the embodiments of the present invention, the crosspoint ferroelectric memory having a high memory cell selectivity can be provided.

Although the examples of specific aspects of the present invention have been described above with reference to the first to fourth embodiments, the present invention is not limited to these embodiments.

The invention claimed is:

1. A ferroelectric memory comprising:
    a number of m platelines in a first interconnect layer where M is a positive integer;
    a number of n bit lines in a second interconnect layer where n is a positive integer; and
    m×n memory cells at m×n intersection points of the m platelines and the n bit lines, wherein each m×n memory cell comprises a ferroelectric capacitor and a zener diode connected in series between any one of the m plate lines and any one of the n bitlines.

2. The memory according to claim 1, wherein
    with regard to a selected cell which is selected from the memory cells,
    when a first value is to be written in the selected cell, a direction of a voltage applied between a plateline and a bitline connected to the selected cell is set to a forward direction of a zener diode of the selected cell, and
    when a second value is to be written in the selected cell, the direction and a magnitude of the voltage applied between the plateline and the bitline connected to the selected cell is set to a reverse direction of the zener diode and a value higher than a zener voltage of the zener diode, respectively.

3. The memory according to claim 2, wherein
    when the second value is to be written in the selected cell,
    a negative potential is applied to one of the plateline and the bitline connected to the selected cell, a positive potential is applied to the other of the plateline and the bitline, and a zero potential is applied to the platelines and the bitlines connected to the memory cells other than the selected cell,
    a magnitude of the positive potential is set to a value lower than the zener voltage,
    a magnitude of the negative potential is set to a value lower than the zener voltage, and
    a magnitude of a difference between the positive potential and the negative potential is set to a value higher than the zener voltage.

4. The memory according to claim 2, wherein
when the second value is to be written in the selected cell,
a zero potential is applied to one of the plateline and the bitline connected to the selected cell, a first positive voltage is applied to the other of the plateline and the bitline, and a second positive potential lower than the first positive potential is applied to the platelines and the bitlines connected to the memory cells other than the selected cell,
a magnitude of the second positive potential is set to a value lower than the zener voltage,
a magnitude of a difference between the first positive potential and the second positive potential is set to a value lower than the zener voltage, and
a magnitude of the first positive potential is set to a value higher than the zener voltage.

5. The memory according to claim 2, wherein
when the first value is to be written in the selected cell,
a positive potential and a zero potential are applied respectively to the plateline and the bitline connected to the selected cell, and the zero potential and the positive potential are applied respectively to the platelines and the bitlines connected to the memory cells other than the selected cell, or
the zero potential and the positive potential are applied respectively to the plateline and the bitline connected to the selected cell, and the positive potential and the zero potential are applied respectively to the platelines and the bitlines connected to the memory cells other than the selected cell, and
a magnitude of the positive potential is set to a value lower than the zener voltage.

6. The memory according to claim 2, wherein
when data is to be read out from the selected cell,
a positive potential is applied to the plateline connected to the selected cell, the bitline connected to the selected cell is set to a floating state, and a zero potential and the positive potential are applied respectively to the platelines and the bitlines connected to the memory cells other than the selected cell, or
the zero potential is applied to the plateline connected to the selected cell, the bitline connected to the selected cell is set to the floating state, and the positive potential and the zero potential are applied respectively to the platelines and the bitlines connected to the memory cells other than the selected cell, and
a magnitude of the positive potential is set to a value lower than the zener voltage.

7. The memory according to claim 5, wherein
when data is to be read out from the selected cell or to be written in the selected cell, a cycle in the memory switches in a sequence of a write cycle of the first value and a write cycle of the second value, and
in the write cycle of the first value, when the value read out from the selected cell or to be written in the selected cell is the second value,
the positive potential is applied to the plateline and the bitline connected to the selected cell, and the zero potential and the positive potential are applied respectively to the platelines and the bitlines connected to the memory cells other than the selected cell, or
the zero potential is applied to the plateline and the bitline connected to the selected cell, and the positive potential and the zero potential are applied respectively to the platelines and the bitlines connected to the memory cells other than the selected cell.

8. The memory according to claim 6, further comprising:
a sense amplifier configured to read out the data from the selected cell by setting the bitline connected to the selected cell to the floating state.

9. A ferroelectric memory comprising:
m platelines arranged in a first interconnect layer (m is a positive integer);
n first bitlines arranged in a second interconnect layer positioned under the first interconnect layer (n is a positive integer);
n second bitlines arranged in a third interconnect layer positioned above the first interconnect layer; and
2×m×n memory cells arranged at m×n intersection points of the m platelines and the n first bitlines and at m×n intersection points of the m platelines and the n second bitlines, each of the 2×m×n memory cells including a ferroelectric capacitor and a zener diode connected in series between any one of the m platelines and any one of the n first bitlines or the n second bitlines.

10. The memory according to claim 9, wherein
in each of the memory cells arranged between the first interconnect layer and the second interconnect layer, an anode of the zener diode is arranged in the first bitline side, and in each of the memory cells arranged between the first interconnect layer and the third interconnect layer, an anode of the zener diode is arranged in the second bitline side, or
in each of the memory cells arranged between the first interconnect layer and the second interconnect layer, a cathode of the zener diode is arranged in the first bitline side, and in each of the memory cells arranged between the first interconnect layer and the third interconnect layer, a cathode of the zener diode is arranged in the second bitline side.

11. The memory according to claim 9, wherein
with regard to a selected cell which is selected from the memory cells,
when a first value is to be written in the selected cell, a direction of a voltage applied between a plateline and a bitline connected to the selected cell is set to a forward direction of a zener diode of the selected cell, and
when a second value is to be written in the selected cell, the direction and a magnitude of the voltage applied between the plateline and the bitline connected to the selected cell is set to a reverse direction of the zener diode and a value higher than a zener voltage of the zener diode, respectively.

12. The memory according to claim 11, wherein
when the second value is to be written in the selected cell,
a negative potential is applied to one of the plateline and the bitline connected to the selected cell, a positive potential is applied to the other of the plateline and the bitline, and a zero potential is applied to the platelines and the bitlines connected to the memory cells other than the selected cell,
a magnitude of the positive potential is set to a value lower than the zener voltage,
a magnitude of the negative potential is set to a value lower than the zener voltage, and
a magnitude of a difference between the positive potential and the negative potential is set to a value higher than the zener voltage.

13. The memory according to claim 11, wherein
when the second value is to be written in the selected cell,
a zero potential is applied to one of the plateline and the bitline connected to the selected cell, a first positive voltage is applied to the other of the plateline and the bitline, and a second positive potential lower than the first positive potential is applied to the platelines and the bitlines connected to the memory cells other than the selected cell, a magnitude of the second positive potential is set to a value lower than the zener voltage, a magnitude of a difference between the first positive potential and the second positive potential is set to a value lower than the zener voltage, and a magnitude of the first positive potential is set to a value higher than the zener voltage.

14. The memory according to claim 11, wherein when the first value is to be written in the selected cell, a positive potential and a zero potential are applied respectively to the plateline and the bitline connected to the selected cell, and the zero potential and the positive potential are applied respectively to the platelines and the bitlines connected to the memory cells other than the selected cell, or the zero potential and the positive potential are applied respectively to the plateline and the bitline connected to the selected cell, and the positive potential and the zero potential are applied respectively to the platelines and the bitlines connected to the memory cells other than the selected cell, and a magnitude of the positive potential is set to a value lower than the zener voltage.

15. The memory according to claim 11, wherein when data is to be read out from the selected cell, a positive potential is applied to the plateline connected to the selected cell, the bitline connected to the selected cell is set to a floating state, and a zero potential and the positive potential are applied respectively to the platelines and the bitlines connected to the memory cells other than the selected cell, or the zero potential is applied to the plateline connected to the selected cell, the bitline connected to the selected cell is set to the floating state, and the positive potential and the zero potential are applied respectively to the platelines and the bitlines connected to the memory cells other than the selected cell, and a magnitude of the positive potential is set to a value lower than the zener voltage.

16. The memory according to claim 14, wherein when data is to be read out from the selected cell or to be written in the selected cell, a cycle in the memory switches in a sequence of a write cycle of the first value and a write cycle of the second value, and in the write cycle of the first value, when the value read out from the selected cell or to be written in the selected cell is the second value, the positive potential is applied to the plateline and the bitline connected to the selected cell, and the zero potential and the positive potential are applied respectively to the platelines and the bitlines connected to the memory cells other than the selected cell, or the zero potential is applied to the plateline and the bitline connected to the selected cell, and the positive potential and the zero potential are applied respectively to the platelines and the bitlines connected to the memory cells other than the selected cell.

17. The memory according to claim 15, further comprising:

a sense amplifier configured to read out the data from the selected cell by setting the bitline connected to the selected cell to the floating state.

18. The memory according to claim 9, wherein interconnect layers each of which includes m platelines, and interconnect layers each of which includes n bitlines are alternately arranged under the second interconnect layer and above the third interconnect layer, m×n memory cells are arranged at m×n intersection points of the m platelines and the n bitlines between any adjacent interconnect layers under the second interconnect layer and above the third interconnect layer, and each of the m×n memory cells includes a ferroelectric capacitor and a zener diode connected in series between any one of the m platelines and any one of the n bitlines.

19. The memory according to claim 18, wherein in each of the memory cells, an anode of the zener diode is arranged in the plateline side and a cathode of the zener diode is arranged in the bitline side, or a cathode of the zener diode is arranged in the plateline side and an anode of the zener diode is arranged in the bitline side.

20. The memory according to claim 18, wherein when the first or second value is to be written in the selected cell which is selected from the memory cells, the zero potential is applied to all the platelines and the bitlines in interconnect layers which are at least a predetermined number of layers away from the plateline and the bitline connected to the selected cell.

* * * * *